(12) United States Patent
Noah et al.

(10) Patent No.: US 6,435,229 B1
(45) Date of Patent: Aug. 20, 2002

(54) BULK CHEMICAL DELIVERY SYSTEM

(75) Inventors: Craig M. Noah, Mountain View, CA (US); John N. Gregg, Marble Falls, TX (US); Robert M. Jackson, Burnet, TX (US); Craig Esser, Austin, TX (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/462,690

(22) PCT Filed: Jul. 10, 1998

(86) PCT No.: PCT/US98/14373
§ 371 (c)(1),
(2), (4) Date: Sep. 1, 2000

(87) PCT Pub. No.: WO99/02251
PCT Pub. Date: Jan. 21, 1999

Related U.S. Application Data
(60) Provisional application No. 60/052,219, filed on Jul. 11, 1997, provisional application No. 60/057,292, filed on Aug. 29, 1997, and provisional application No. 60/088,405, filed on Jun. 8, 1998.

(51) Int. Cl.[7] .................................................. B65B 1/04
(52) U.S. Cl. ........................... 141/231; 141/2; 141/21; 141/61
(58) Field of Search ............................... 141/2, 18, 21, 141/61, 95, 198, 231; 137/209, 316, 412

(56) References Cited

U.S. PATENT DOCUMENTS

| 2,160,062 A | 5/1939 | Drake et al. |
|---|---|---|
| 2,536,273 A | 1/1951 | Gahagan |
| 2,777,914 A | 1/1957 | Brown |
| 3,419,695 A | 12/1968 | Dinkelkamp et al. |
| 3,646,293 A | 2/1972 | Howard |
| 3,731,805 A | 5/1973 | Schniers |
| 3,826,139 A | 7/1974 | Bachman |
| 4,056,979 A | 11/1977 | Bongort et al. |
| 4,064,755 A | 12/1977 | Bongort et al. |
| 4,134,514 A | 1/1979 | Schumacher et al. |
| 4,298,037 A | 11/1981 | Schumacher et al. |
| 4,425,949 A | 1/1984 | Rowe, Jr. |
| 4,436,674 A | 3/1984 | McMenamin |
| 4,576,552 A | 3/1986 | Smith |
| 4,676,404 A | * 6/1987 | Yamazaki et al. ............ 222/56 |
| 4,730,491 A | 3/1988 | Lew |

(List continued on next page.)

FOREIGN PATENT DOCUMENTS

| DE | 1036717 | 8/1958 |
|---|---|---|
| EP | 0723214 A1 | 7/1996 |
| WO | WO95/20127 | 7/1995 |
| WO | WO00/00767 | 1/2000 |

OTHER PUBLICATIONS

B/W Unifloat® Liquid Level Control Systems, New Single float/multiple switch level sensing system provides versatile, reliable means of controlling and type of liquid!, Brochure by B/W Controls Inc.
Transfil™, Chemical Refill System, Brochure by Air Products and Chemicals, Inc., Aug. 1991, Rev. 1, Schumacher.
Announcing A New Era In Liquid Chemical Delivery, Transfil II198 , Apr. 1990, product Brochure by Schumacher.

Primary Examiner—Gregory L. Huson
Assistant Examiner—Peter deVore
(74) Attorney, Agent, or Firm—Oliver A. Zitzmann; Margaret Chappuis; Robert M. O'Keefe

(57) ABSTRACT

A bulk chemical delivery system, comprising: a bulk chemical canister that is connected to at least one manifold box, wherein each manifold box has at least two output lines, wherein each output line connects to a secondary canister. In non-limiting representative example, the bulk chemical canister may have a capacity of 200 liters. Also disclosed are novel manifolds for use in delivering chemicals from canisters and a transportation/containment cart.

19 Claims, 17 Drawing Sheets

U.S. PATENT DOCUMENTS

| | | |
|---|---|---|
| 4,859,375 A | 8/1989 | Lipisko et al. |
| 4,976,146 A | 12/1990 | Senghaas et al. |
| 4,979,545 A | 12/1990 | Fair |
| 4,979,643 A | 12/1990 | Lipisko et al. |
| 5,038,840 A | 8/1991 | Fair |
| 5,041,267 A | 8/1991 | Randtke et al. |
| 5,069,244 A | 12/1991 | Miyazaki et al. |
| 5,079,950 A | 1/1992 | McKiernan et al. |
| 5,103,673 A | 4/1992 | Sawada et al. |
| 5,137,063 A | 8/1992 | Foster et al. |
| 5,148,945 A | 9/1992 | Geatz |
| 5,220,517 A | 6/1993 | Sierk et al. |
| 5,285,812 A | 2/1994 | Morales |
| 5,293,893 A | 3/1994 | O'Dougherty |
| 5,329,463 A * | 7/1994 | Sierk et al. ............ 364/510 |
| 5,329,963 A | 7/1994 | Jones et al. |
| 5,330,072 A | 7/1994 | Ferri, Jr. et al. |
| 5,551,309 A * | 9/1996 | Goossens et al. ............ 73/863 |
| 5,607,002 A * | 3/1997 | Siegele et al. ............ 141/198 |
| 5,620,524 A | 4/1997 | Fan et al. |
| 5,950,693 A * | 9/1999 | Noah et al. ............ 141/231 |
| 5,964,254 A | 10/1999 | Jackson |
| 6,056,024 A * | 5/2000 | Noah et al. ............ 141/21 |

* cited by examiner

BULK CHEMICAL DELIVERY SYSTEM

This application claims priority to application Ser. No. 60/052,219, filed Jul. 11, 1997, Ser. No. 08/893,913, filed Jul. 11, 1997, Ser. No. 60/057,262, filed Aug. 29, 1997, Ser. No. 09/046,907, filed Mar. 24, 1998, and Ser. No. 60/088,405, filed Jun. 8, 1998, all of which are incorporated herein by reference.

BACKGROUND OF INVENTION

This invention generally pertains to a system and manifolds for delivering chemicals such as tetraethylorthosilicate (TEOS) from bulk delivery canisters to manufacturing process tools such as chemical vapor deposition (CVD) devices.

The production of electronic devices such as integrated circuits is well known. In certain steps in such production, chemical may be fed to certain process tools which use the chemical. For instance, a CVD reactor is commonly employed to generate a layer of a given material, such as a layer of amorphous silicon oxide from TEOS. Historically, the TEOS was fed to the CVD reactor via bulk delivery cabinets utilizing 5 or 10 gallon canisters. The increase in consumption of TEOS has increased significantly due to increased metal layers and 300 mm processes. The more complex processes on larger wafers have also put pressure on the economics of each layer. 200 liter canisters allow for economies of scale savings that are passed on to the customer. In addition, the larger bulk canister reduces the number of container changes, labor, and shipping costs. In view of an increase in TEOS requirements for manufacturing operations, a need exists for a system which supplies an uninterrupted stream of chemicals to multiple process tools. Similarly, since existing fabrication facilities routinely change out canisters at each cabinet, and since each replacement results in potential contamination of the system, it would be desirable to reduce the number of contamination points.

Traditionally, high purity TEOS (and dopants) has been fed to the CVD reaction chamber from a small volume container called an ampule. More recently, stainless steel containers have been developed, such as described in U.S. Pat. Nos. 5,45,766; 5,562,132; and 5,607,002. The present inventors have discovered that the manifold systems disclosed in these patents which was designed for materials of known physical properties and not acutely toxic were needed to be changed to accommodate other, more agressive chemicals. In addition, the present inventors have sought to improve on the fail safe nature of the system. The present inventors have thus determined that a need exists for an improved manifold for use in the refill systems such as described in the above-referenced patents.

SUMMARY OF INVENTION

The present invention provides a solution to one or more of the disadvantages and needs addressed above.

In one respect, the present invention is a bulk chemical delivery system, comprising: a bulk chemical canister that is connected to at least one manifold box, wherein each manifold box has at least two output lines, wherein at least one output line connects to a secondary canister.

The system may enable supply of large scale high purity liquid chemicals to multiple process tools such as multiple CVD reactors. By way of illustration, in the embodiment of this invention depicted in FIGS. 1 and 1A, by including four valve manifold boxes which each feed chemical to four cabinets which each have four output lines, the system may provide chemicals to 64 process tools. It should be appreciated, however, that the number of exit lines from the manifold boxes, bulk cabinet, and secondary cabinet may vary widely, and any number of exit lines may be used. It is also contemplated that one or more additional manifold boxes may be used in series to further split the chemical feed.

In another broad respect, this invention is a bulk chemical delivery system, comprising: a bulk chemical canister that is connected to at least one manifold box having at least two output lines, wherein at least one output line may optionally be connected to a process tool or a secondary canister. In an alternative embodiment, this invention is a bulk chemical delivery system, comprising: a manifold box having at least two output lines, wherein at least one of the output lines connects to a canister. In yet another alternative embodiment, this invention is a bulk chemical delivery system, comprising, a manifold box having at least two output lines, wherein at least one of the output lines connects to a process tool.

In another broad respect, this invention is a process useful for providing a chemical to a process tool that is used in the fabrication of electronic devices, comprising: supplying a chemical to a process tool from a secondary canister that is fed chemical from a valve manifold box which is supplied chemical by a bulk canister. In one embodiment, the bulk canister has a capacity of about 200 liters and wherein the secondary canister has a smaller capacity than the bulk canister. In one embodiment, the chemical is tetraethylorthosilicate. In one embodiment, a second bulk canister optionally provides chemical to the valve manifold box, either directly or indirectly through a manifold connected to a bulk canister.

In addition, in another broad respect, this invention is a process for the manufacture of a bulk chemical supply system, comprising: providing a first bulk canister and connecting the first bulk canister to at least two valve manifold boxes that each have at least two exit ports; connecting each exit port to a secondary canister that is adapted for delivery of chemical to a process tool.

In another broad respect, this invention is a bulk chemical supply system, comprising: a bulk canister connected to at least one valve manifold box that has at least two exit ports wherein at least one of the exit ports is connected to a secondary canister.

In another broad respect, this invention is a process for the manufacture of an electronic device comprising supplying a chemical to a process tool from a second canister that is fed chemical from a valve manifold box which itself is supplied chemical from a bulk canister. In addition, this invention is an electronic device made according to this process.

As used herein, "process tool" refers to a process tool which ultimately uses the chemical provided by the system of this invention. The system of this invention may thus provide chemicals to any process tool which requires a chemical during its use. Such process tools may include apparatuses for chemical vapor deposition, photolithography, and etch applications. These process tools are frequently used in the fabrication of electronic devices such as integrated circuits, memory circuits, flat panel display, possibly fiber optic manufacturing, multichip modules (e.g., "MCMs"), and so forth. In addition, it should be appreciated that while this invention may be used to supply a chemical such as TEOS to a process tool such as a CVD reactor used in the fabrication of integrated circuits, memory devices, and the like, the system may be used in other processes.

In one broad respect, this invention is a bulk chemical supply system, comprising: a cabinet that houses a bulk chemical canister that is connected to a distribution manifold; at least one manifold box that connects to at least one distribution manifold, wherein the manifold box includes at least two output lines and wherein at least one output line is connected to a secondary canister that is connected to a second distribution manifold, and that is housed in a secondary cabinet.

In another broad respect, this invention is a process useful for providing a chemical to a process tool that is used in the fabrication of electronic devices, comprising: supplying a chemical to a process tool from a secondary canister that is fed chemical from a valve manifold box which is supplied chemical by a bulk canister.

In another broad respect, this invention is a process for the manufacture of a bulk chemical supply system, comprising: providing a first bulk canister and connecting the first bulk canister to at least two valve manifold boxes that each have at least two exit ports; connecting at least one exit port to a secondary canister that is adapted for delivery of chemical to a process tool.

In yet another broad respect, this invention is a process for the manufacture of an electronic device comprising supplying a chemical to a process tool from a second canister that is fed chemical from a valve manifold box which itself is supplied chemical from a bulk canister.

In another broad respect, this invention is a manifold for use in refill of canister containing chemicals, comprising: (1) a vacuum supply valve; (2) a vacuum generator; (3) a pressure vent valve; (4) a carrier gas isolation valve; (5) a bypass valve; (6) a process line isolation valve; (7) a control valve; (8) a canister inlet valve; (9) a canister outlet valve; wherein the vacuum supply valve is connected to the vacuum generator; wherein the vacuum generator is connected to the pressure vent valve and the control valve; wherein the carrier gas isolation valve is connected to pressure vent valve and bypass valve; wherein the bypass valve is further connected to isolation valve and the canister inlet valve; wherein the process line isolation valve is also connected to canister outlet valve; wherein canister inlet valve is connected to control valve and canister outlet valve.

In another broad respect, this invention is a manifold useful for refillably connecting two canisters containing liquid chemicals, comprising: a vacuum supply valve connected to a vacuum generator; a pressure vent valve connected to the vacuum generator and to a gas inlet valve; a control valve connected to vacuum generator; wherein the carrier gas isolation valve is also connected to a bypass valve, a process line isolation valve connected to a canister outlet valve and to the bypass valve, and a canister inlet valve connected to the bypass valve, the control valve, and a canister outlet valve.

In another broad respect, this invention is a method of connecting a canister to a manifold, comprising: connecting the fittings of a canister to the fittings of a manifold to thereby provide a delivery system; and purging the delivery system, wherein the manifold comprises a vacuum supply valve; a vacuum generator; a pressure vent valve; a carrier gas isolation valve; a bypass valve; a process line isolation valve; a control valve; a canister inlet valve; a canister outlet valve; wherein the vacuum supply valve is connected to the vacuum generator; wherein the vacuum generator is connected to the pressure vent valve and the control valve; wherein the gas inlet valve is connected to pressure vent valve and bypass valve; wherein the bypass valve is further connected to process line isolation valve and the canister inlet valve; wherein the process line isolation valve is also connected to canister outlet valve; wherein canister inlet valve is connected to control valve and canister outlet valve.

In another broad respect, this invention is a method of manufacturing a manifold, comprising: providing a vacuum supply valve, a vacuum generator, a pressure vent valve, a carrier gas isolation valve, a bypass valve, a process line isolation valve, a control valve, and a canister inlet valve; connecting the valves with lines such that the vacuum supply valve is connected to the vacuum generator, the vacuum generator is connected to the pressure vent valve and the control valve, the gas inlet valve is connected to the pressure vent valve and the bypass valve, the bypass valve is further connected to the process line isolation valve and the canister inlet valve, the isolation valve is also connected to the canister outlet valve, the canister inlet valve is connected to the control valve and the canister outlet valve.

In another broad respect, this invention is a manifold for use in refill of canister containing chemicals, comprising: (1) a vacuum supply valve; (2) a vacuum generator; (3) a carrier gas isolation valve; (4) a bypass valve; (5) a process line isolation valve; (6) a control valve; (7) a canister inlet valve; (8) a canister outlet valve; wherein the vacuum supply valve is connected to the vacuum generator; wherein the vacuum generator is connected to the control valve; wherein the carrier gas isolation valve is connected to the bypass valve; wherein the bypass valve is further connected to the process line isolation valve and the canister inlet valve; wherein the process line isolation valve is also connected to the canister outlet valve; wherein the canister inlet valve is connected to the control valve and the canister outlet valve.

In another broad respect, this invention is a process for manufacturing a manifold for use in refill of canister containing chemicals, comprising: (1) providing a vacuum supply valve; (2) providing a vacuum generator; (3) providing a carrier gas isolation valve; (4) providing a bypass valve; (5) providing a process line isolation valve; (6) providing a control valve; (7) providing a canister inlet valve; (8) providing a canister outlet valve; connecting the vacuum supply valve to the vacuum generator; connecting the vacuum generator to the control valve; connecting the carrier gas isolation valve to the bypass valve; further connecting the bypass valve to the process line isolation valve and the canister inlet valve; further connecting the isolation valve to the canister outlet valve; connecting the canister inlet valve to the control valve and canister outlet valve.

Advantageously, the manifold of this invention enables improved purge efficiency for low vapor pressure materials and toxic chemicals.

DETAILED DESCRIPTION OF THE INVENTION

A general, non-limiting description of metallic canisters, chemical refill system, operating procedures, components, starting manifold system, and so forth, which may be used in the cabinet of this invention is set forth in U.S. Pat. Nos. 5,465,766; 5,562,132; 5,590,695; 5,607,002; and 5,711,354, all of which are incorporated herein by reference.

Figure 1:
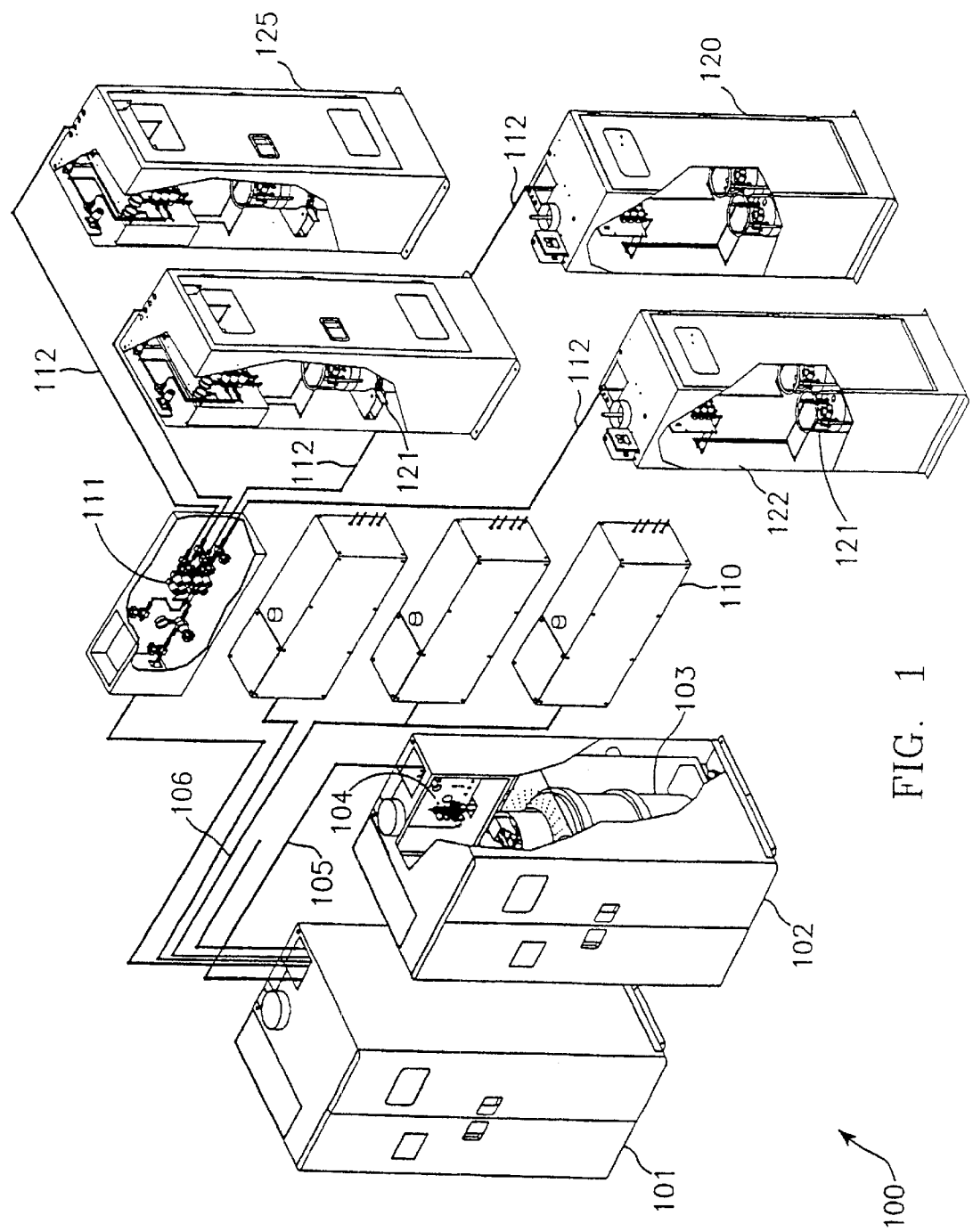
FIG. 1 depicts a representative bulk chemical delivery system of the present invention.

A representative bulk delivery system 100 of this invention is shown in FIG. 1. For each of the valves in the FIGS., the open triangles represent lines which are always open, with the darkened triangles being closed until opened. The system includes at least one bulk canister cabinet 101 which houses a bulk canister, not shown, that supplies chemical to the secondary (intermediate) cabinets either directly or indirectly through manifold boxes 110, and ultimately to the process tool which uses the chemical. The system may optionally include a second bulk cabinet 102 that holds, as shown by cutaway view, a second bulk canister 103 which typically has a capacity of about 200 liters or more. The second bulk canister can supply chemical to the valve manifold boxes when the first bulk canister 101 is being replaced, refilled, repaired, or for any other reason. Alternatively, second bulk cabinet 102 may be employed to refill first cabinet 101 during normal operation.

Figure 1A:
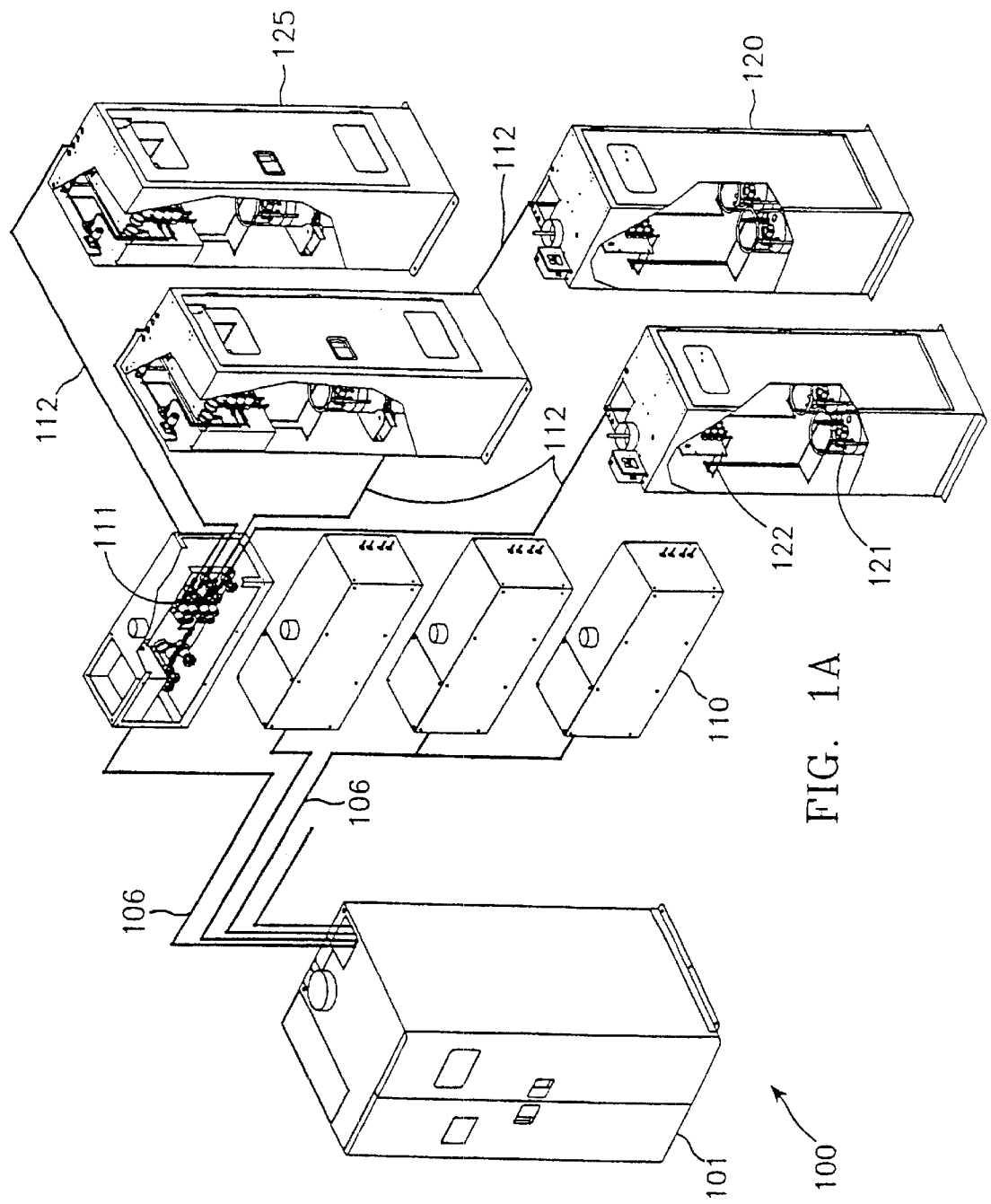
FIG. 1A illustrates a representative bulk chemical delivery system of this invention wherein a single bulk canister cabinet is employed.
Figure 2A:
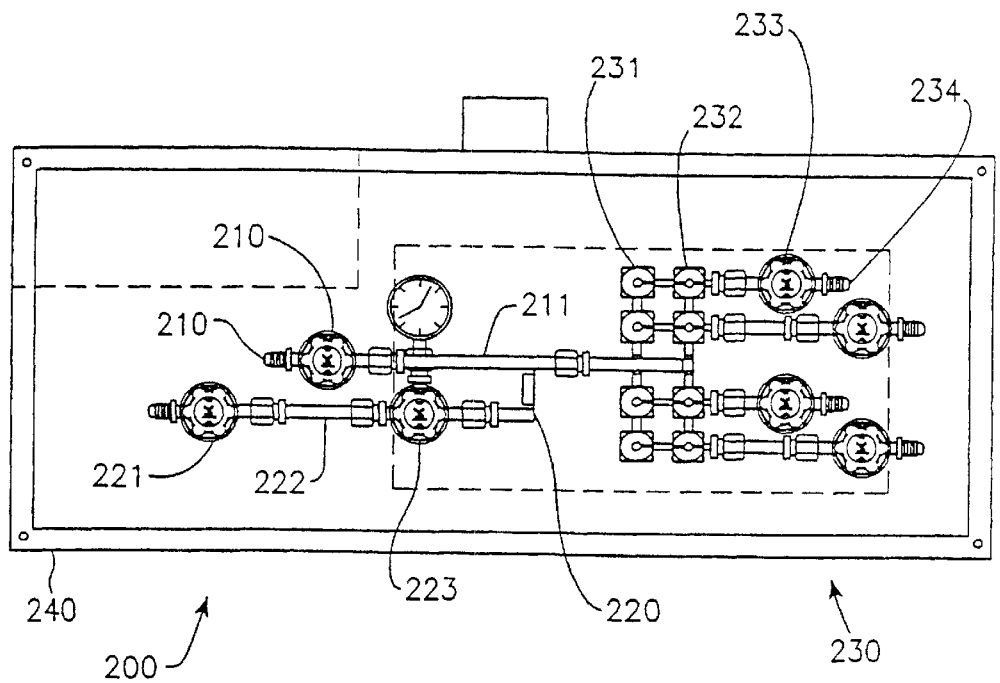
FIGS. 2A, 2B, and 2C illustrate a representative valve manifold box which may be used in this invention.
Figure 2B:
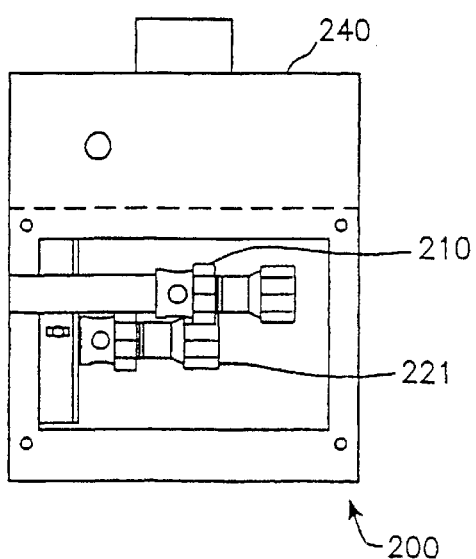
Figure 2C:
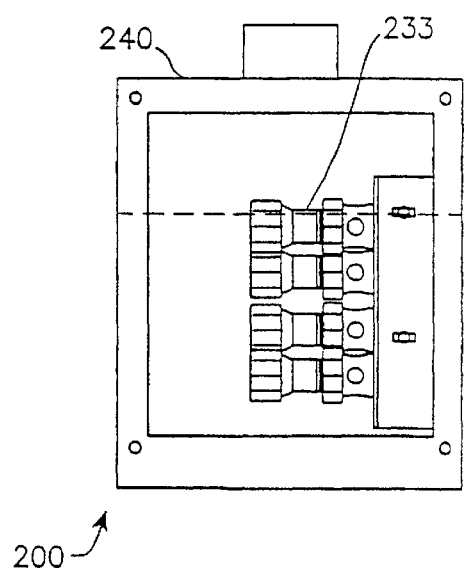

The cabinets 101, 102 may be of a design such as described with reference to FIGS. 3–5. The cabinet 101 or 102 may include a manifold 104 which may be the same or different in each cabinet. Line 105 from the second canister may be connected to the manifold of the first canister in cabinet 101. If second cabinet 102 is used, a switch over capability, such as a switch over manifold, discussed with reference to FIG. 6, may be employed which allows the system to provide chemical from second cabinet 102 while first cabinet 101 is being replaced or refilled. Switch over to second bulk canister 102 may be automated such as by use of process control instrumentation well known to one of skill in the art, such as is available from various commercial sources, such as Omron, Inc. Alternatively, overall system management may be controlled using a programmable computer control system that manages canister replacement and purge functions and controls and monitors system parameters, such as a MARS™ Control System as described for example in U.S. Pat. Nos. 5,465,766 and 5,711,354. The controller may also administrate a purge sequence and normal run mode. A purge sequence serves to purge the manifold and canister connection lines prior to removal of an expired bulk chemical supply canister or after a new canister is installed. During a run mode, the system will provide chemical to the process tool, which may be initiated after installation of a bulk chemical supply canister. In one respect, the overall system may be controlled by a single controller in the bulk canister cabinet, with or without a controller on the secondary cabinet and the valve manifold box to supply data back to the primary controller. Alternatively, each bulk and secondary cabinet, and each valve manifold box, may be equipped with a separate controller to control the functions thereof Lines 106 lead from the manifold in cabinet 101 to one or more valve manifold boxes such as valve manifold boxes 110. Any number of valve manifold boxes 110 may be employed. In one embodiment, up to four boxes are used. Each box 110 may contain a manifold 111 such as depicted in FIGS. 2A, 2B, and 2C, discussed herein. The valve manifold boxes 110 serve to split a stream of chemical by a distribution manifold into multiple lines 112 that lead to either a process tool which uses the chemical or to secondary cabinets 120 and 125 which house one or more smaller canisters 121. Each cabinet may contain any desired number of canisters, and one or more canisters may contain a different chemical that may be supplied to a process tool through a separate distribution manifold. In FIG. 1, secondary cabinet 120 houses two smaller canisters 121 while secondary cabinet 125 houses one smaller canister 121. The precise configuration of the manifold in the valve manifold box is not critical in the practice of this invention so long as the function of providing a stream of chemical to the balance of the system and process tool is achieved. The configuration of the valves in the valve manifold box may be varied to allow for serviceability of the components downstream of the valve manifold box and to allow for independent purging and maintenance of individual lines. Optionally, the line from a manifold box 110 to a secondary cabinet 120 may be disconnected and the system designed and programmed to switch over so that a refill canister 121 delivers make up chemical to another canister 121 with the other canister supplying chemical to the process tool. To facilitate change out of the canister 121 designated to primarily deliver chemical to the process tool, the manifold may be designed, and the controller programmed to enable the refill canister 121 to deliver chemical to the process tool. Typically, however, if either the refill or supply canister is being changed out or the like, the system is designed so that chemical from the manifold box 110 switches over to directly feed the process tool. Process tools may alternatively be fed directly from the valve manifold box in the absence of a secondary cabinet. Similarly, in addition to providing chemical to at least one manifold box, the bulk cabinet may also provide chemical directly to one or more process tools. The valve manifold box may include any number of output lines, and typically includes up to four output lines. In FIGS. 1 and 1A, four output lines are employed.

FIG. 1A shows a representative system 100 of this invention wherein a single bulk canister cabinet 101 is employed. The numbering in FIG. 1A corresponds to that in FIG. 1. As in FIG. 1, any number of valve manifold boxes 110 may be included. Typically, up to four valve manifold boxes 110 are used. Similarly, the number of secondary cabinets 120 and/or 125 used may vary, and typically up to four are employed. Thus, a valve manifold box 110 may be alternatively designed to include as many exit ports as desired. It should also be appreciated that in a given system 100, the secondary cabinets may include one canister as in cabinet 125 or may include two canisters as in cabinet 120, or a combination of cabinets may be used, such as for a system where one or more cabinets 120 hold a single canister and one or more cabinets 125 hold two canisters. In addition, cabinets 120 and 125 may be modified as desired to include a larger or smaller number of canisters, and there are no restrictions on the number of canisters that may be used in an alternate design. There are also no restrictions on the size of the-bulk canister in cabinet 101 or the size of canisters in cabinets 120 and 125, but in general the canister in cabinet 101 is larger than the canisters in cabinets 120 and 125.

A valve manifold box 200 which may be used in the practice of this invention is depicted in FIGS. 2A, 2B, and 2C. In FIG. 2A, inlet valve 210 receives chemical as from an exit line from the supply manifold of FIG. 1. Inlet valve 210 may be a manual or pneumatic valve or a dual activator valve that would allow full purging of the manifold if there is a need to service the manifold valves. It is contemplated that a valve manifold 110 may optionally receive chemical from multiple sources, such as from two or more bulk canisters. The use of welded connections to the inlet valve and pneumatic activators may enhance the safety considerations relating to spill detection. A line 211 from the inlet valve 210 leads to a group of two or more exit ports, with four exit ports being depicted in FIG. 2A. Line 211 is pressurized by gas, such as helium, from pressure line 220. Pressure line 220 is supplied gas via a source of gas (not shown) which delivers pressurized gas to gas inlet valve 221, thereafter flowing through line 222 and regulator valve 223 which controls the flow into line 220. Pressure line 220 is optional, although typically employed for practicality. The chemical is split in the splitter section 230 of the valve manifold box 200 via two or more pairs of properly ported purge valves 231 and liquid control valves 232. With liquid control valves 232 closed, the valve porting still allows purge gas from purge valve 231 to flow across the top of the seat of liquid control valves 232 and into the exit ports 234 that may couple to an output line that feeds an intermediate cabinet or process tool which may optionally employ an on-board refillable container. This purging allows the purge or draining of liquid in one branch while the others remain on-line. Output valves 233 regulate the output of chemical through each of the output lines. The valve manifold may be contained within housing 240 which may be in the form of a rectangular box made up of six walls. The housing 240 may be made of any suitable material such as sheet metal which is assembled using conventional methods such as by welding or use of suitable fasteners. The front wall may optionally be made of a clear material such as Plexiglas. The housing 240 may include appropriately sized and positioned holes for inlet and outlet lines. In addition, the manifold box may include a liquid sensor and drain outlet from which liquid chemical may be removed that has collected on the bottom of the manifold box. The bottom of the box may be sloped so that a spill may collect in a particular location. The sensor may provide a signal to the controller whereby an operator is alerted, the line to the manifold box is shut down, and so forth.

FIG. 2B is a first side view of the valve manifold box 200. In FIG. 2B, a side view of the inlet side of the valve manifold box, there are removable plates on each end to allow for more flexibility and easier changes to piping and/or connections to the valve manifold box. The removable plate may be a split plate.

FIG. 2C is a second side view of the valve manifold box 200. In FIG. 2C, the outlet side is shown which also uses removal plates and in this case it is a split plate to allow ease of removal to add additional lines while one or more are already in place.

A typical bulk cabinet with a permanent secondary containment area, such as in an electronic device (e.g., an integrated circuit) fabrication facility, requires the containers to be lifted into a cabinet. When the container holds 5 or 10 gallons of chemical, there is no great difficulty in manually lifting the container up (typically 8–12 inches) into the cabinet. However, for larger canisters, such as 200 liter canisters, such lifting becomes impractical. The design considered below alleviates the problems and issues arising in connection with placing a large 200 liter canister in a cabinet.

Figure 3:
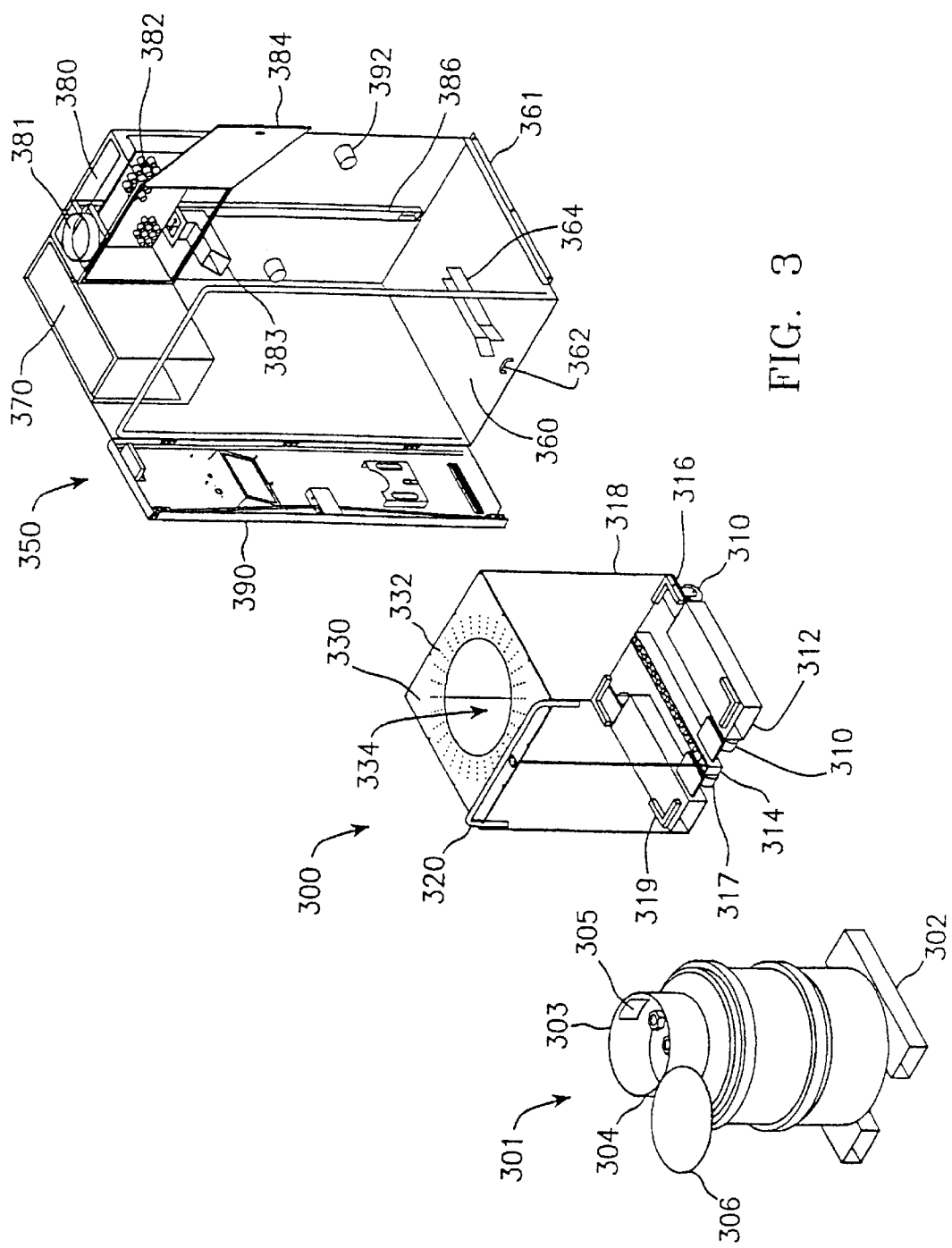
FIGS. 3–5 illustrate a transportation cart which may be used in the practice of this invention, and which may provide containment for spill or leak of chemical.
Figure 4:
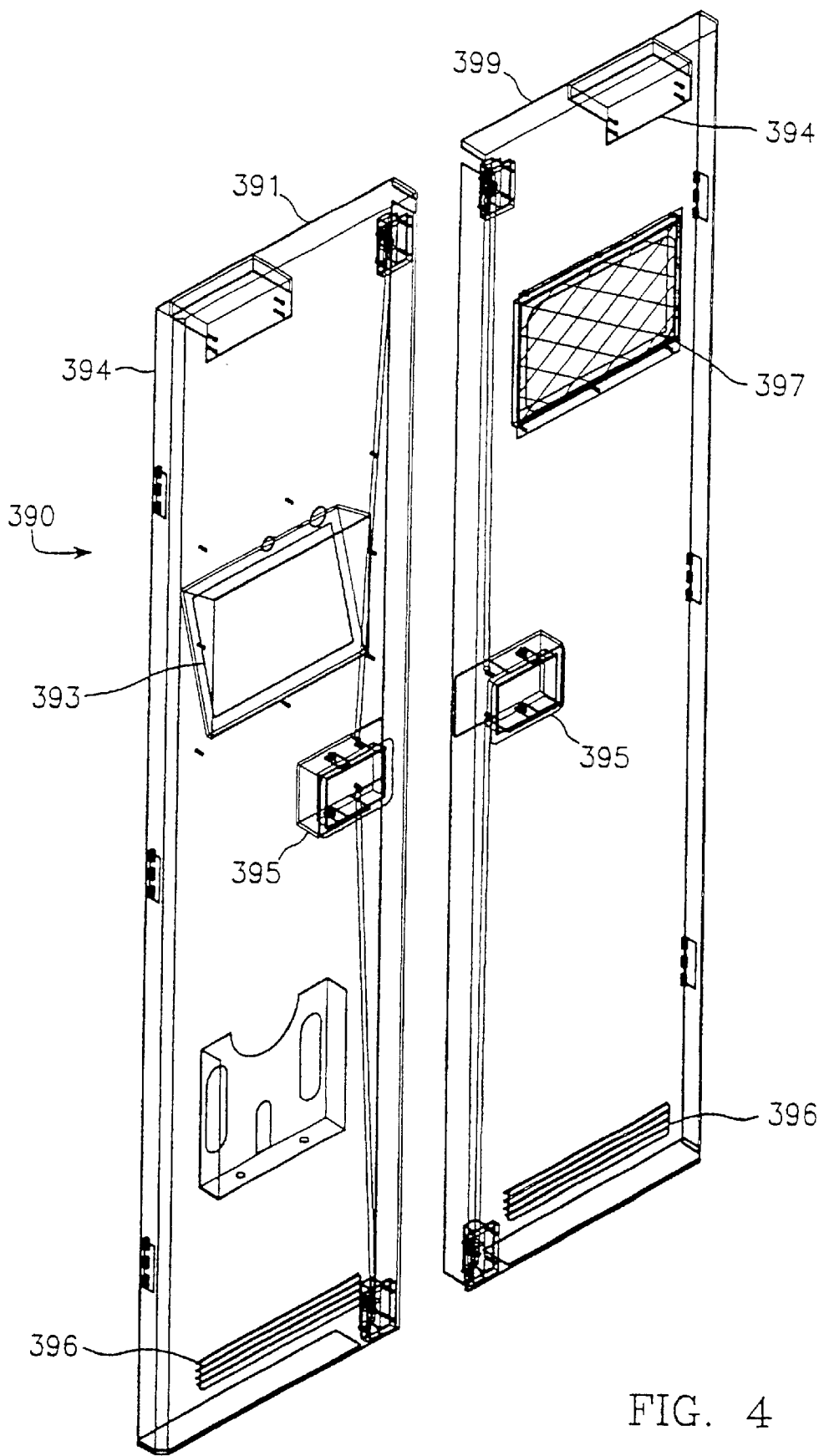
Figure 5:
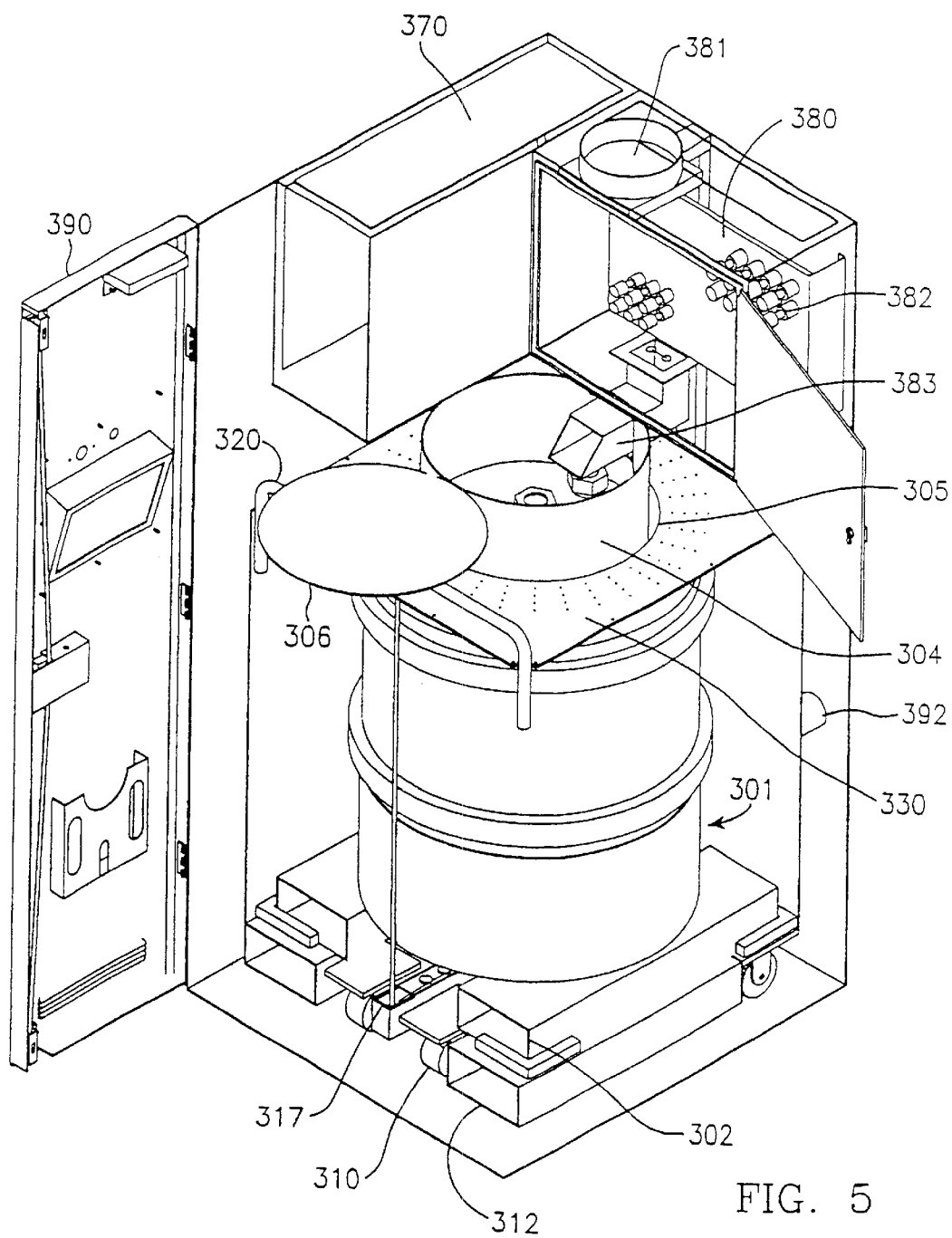

The bulk canisters 103 may be contained within a shipping cart, such as depicted in FIGS. 3–5. FIG. 3 shows such a bulk delivery system. The system includes bulk chemical canister 301, a mobile containment transportation cart 300, and a bulk chemical cabinet 350 to house canister 301 and cart 300. In practice, canister 301 may be placed in cart 300 by lifting it using an overhead crane or the like when appropriate holds are on the canister 301.

The canister 301, which may also be variously referred to as a canister or storage vessel, may be of a wide variety of sizes, with a 200 liter size being especially applicable for use in the practice of the present invention. The canisters may be of conventional design and/or designed for a particular use, and are in general adapted to contain and provide a liquid chemical. The canisters are typically made from stainless steel, with or without a liner. Canister 301 includes fittings 303 by which lines (not shown) may be connected so that the chemicals can be delivered from the canister while maintaining a very high purity. The canister 301 may include internal lines (not shown) to the bottom, as well as one or more sensors (a dozen sensors may be employed) to detect the level of chemicals in the canister 301. The sensors can be a liquid sensor, either discrete or continuous. In addition, canister 301 includes hole 305 in vertical sheath 304 for receiving scoop 383, described below. It should be appreciated that the particular fittings 303 employed may vary widely, and simply need to be matched with appropriate fittings of lines emanating from valve manifold 380. Canister 301 may also include sleeves 302 which may be welded to the canister, or which may be simply placed under canister 301 to be held in place when at rest by the weight of the canister. The sleeves 302 may be appropriately designed to receive the forks of a forklift. The cart may include a locking device to secure the cart firmly into the cabinet once it is in place. Lid 306 may be used to protect the fitting during storage or shipping.

One or more pressure transducers may be added (redundant transducers may be used) on a spare port of the canister to allow for pressure management control to keep an inlet valve for helium or the like closed during operation and to only open when the volume is down.

As shown in FIG. 3, movable cart (or "crate") 300 includes wheels (rollers) 310, attached to base 316, which may be of appropriate size and suitably durable depending on the size of the canister 301. The wheels 310 may include brakes, including a parking brake or deadman's brake. Cart 300 may include sleeves 312, as part of or attached to base 316, to receive forks of a forklift, for example. The cart 300 may include a drain line for facilitating removal of at least a portion, preferably the majority, of a liquid spill prior to removing a cart 300 from a cabinet 350. Cart 300 may include guide 314 which aligns with guide 364 in the cabinet 350 to facilitate alignment of the cart 300 as it is positioned into cabinet 350. The guide 314 may be a part of or attached to base 316, and may be secured to base 316 using conventional methods (e.g., using screws or bolts, or by welding). Alternatively, the guide 314 may be designed as a rail, for example, which is attached to the one or more sides of the cart 300, with complimentary guides attached to appropriate positions on the sides of the cabinet. In another alternative, the guides may be spring-loaded, ball bearing tracks which snap into position when the cart is in correct alignment, as would be readily apparent to one of skill in the art. Also attached to base 316 are four exterior walls 318. Typically, the base and sides are welded together or seamless sidewalls are used. The base may be angled, grooved, or the like toward the sensor 317. Similarly, the base may optionally include a low volume trough to collect small spills, thereby enhancing the ability of the sensor 317 to detect such small spills. Alignment guides 319 may be employed to position the canister 301 in cart 300. The cart 300 may include an exhaust duct to provide ventilation for vapor which is denser than air. Handle 320 may be optionally secured to cart 300 to assist an operator in maneuvering cart 300. The top 330 of cart 300 may include an appropriate sized hole 334 to accommodate the top of canister 301. It is preferred that hole 334 be dimensioned so that top 330 snugly fits to assist in securing canister 301 within cart 300 during shipping and movement. Top 330 may optionally be perforated with holes 332. The holes 332 serve to allow a leak in the upper portion of canister 301 to drain into the lower portion of cart 300. Additionally, a removable part may be used which seals the fitting from exposure to the environment, which may be beneficial when the canister is being placed in a clean room for use. This would protect accumulation of dust and the like on and in the cart and canister. In addition, sensor 317 may be included to sense liquid spills. The sensor may be connected to a controller which may signal an operator or shut down the system in the case of a detected spill. It is currently recommended in the industry that the volume of a containment unit be at least 110% of the volume of canister 301. Accordingly, in one embodiment of this invention, the cart 300 is constructed such that it has a capacity of at least 110% of the internal volume of the canister 301 which cart 300 is designed to house.

Cabinet 350 includes three sides 391, a base 360, door(s) 390, and a top. One or more brace 361 may be attached to the cabinet to support the structure, as by bolting to the floor where the cabinet is housed. Alternatively, the brace 361 may be replaced by use of holes in the cabinet base for securing the base of the cabinet directly to the floor, thereby reducing the footprint of the cabinet. One or more doors may be used. When two doors are employed, door stop 362 may be included. The cabinet may include a compartment 370 (or "control box") for installation of process control instrumentation. Alternatively, the process control instrumentation may be situated outside the cabinet. Process control instrumentation is well known and available from various commercial sources, such as Omron, Inc. The process control instrumentation may be connected to touch screen 393 as illustrated in FIG. 4.

Figure 6:
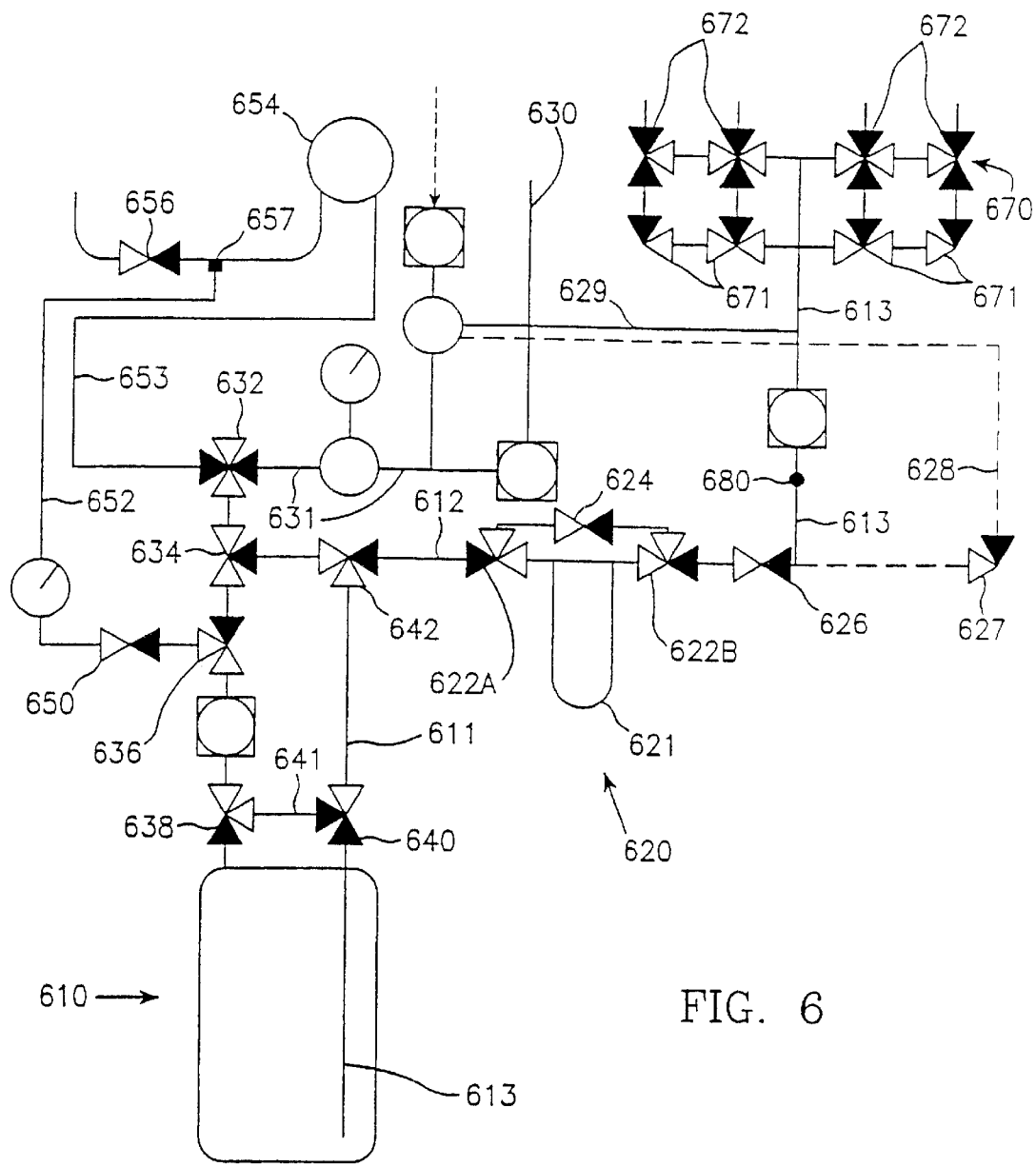
FIGS. 6 illustrates a representative manifold schematic for use in the bulk cabinet.

The cabinet may include a valve manifold 380 having a given number of valves 382 (e.g., pneumatically actuated valves), such as described in U.S. Pat. Nos. 5,465,766; 5,562,132; 5,590,695; 5,607,002; and 5,711,354, all of which are incorporated herein by reference, or as described herein. The manifold may be advantageously designed such that there are no unpurged dead legs in the manifold, lines, and fittings. In this regard, the design may advantageously include no bends in tubing interconnection lines and no flex lines. In general, pressure in the system is adjusted so that pressure on the upstream side is higher than on the downstream side. A non-limiting example of a representative manifold and system line design in the cabinet for the bulk canister is illustrated in FIG. 6. In FIG. 3 valves 382 may be controlled using process control instrumentation housed in control box 370. It should be appreciated that a wide variety of valves may be used, including but not limited to manually activated valves, pneumatically activated valves, or any other type of valve. A manifold door 384 may be included to close off valve manifold. Scoop 383 may be included in cabinet 350 from which manifold lines may be placed. The scoop 383 may be appropriately dimensioned to fit into hole 305 of canister 301. The scoop 383 may also be sized to allow adequate exhaust flow. The scoop 383 may thus contain the entire flow of exhaust in the cabinet and can be adjusted for proper balancing. The scoop 383 may also serve the function of directing any liquid spills in the manifold area down to the cart 300 which provides containment for such a spill. In FIG. 3, a tube 386 is also shown which has a vent opening bottom portion, with the tube being tied into the exhaust to thereby allow for adjustment and balancing of exhaust flow through the cabinet. Cabinet may also include exhaust outlet 381. Optionally, bumpers 392 may be attached on the rear side of cabinet 350 to act as stops for cart 301.

FIG. 4 shows a dual door system for use as door(s) 390 in cabinet 300 of FIG. 3. While a dual door system is depicted in FIG. 4, one or more doors may be alternatively used. In FIG. 4, left door 399 and right door 391 are depicted with the side interior to the cabinet 350 being shown. Each door may include spring loaded hinges 394 to mount each door to cabinet 350, door locks 395, and vents 396. In addition, door 391 may include touch screen 393 which connects to process control instrumentation. The touch screen 393 may serve to allow an operator to observe or change the process configuration.

FIG. 5 illustrates canister 301 when placed in cart 300 which is housed in cabinet 350. FIG. 5 thus shows the configuration of the system of this invention. Canister 301 has been placed in cart 300 as by use of crane, with top 330 thereafter being secured onto cart 300, which thereby diminishes lateral movement and sway of canister 301. Canister 301 may be filled either before or after installation into cart 300. In FIG. 5, it can be seen that scoop 383 may be slid through hole 305 in vertical sheath 304 such that "pigtails" (i.e., manifold lines) may be protected from abrasion from the edge of hole 305. A spring loaded lifting device may also be employed to automatically lift the pigtails when disconnected. It can also be seen that vertical sheath 304, which protects fittings 303 during handling, fits in hole 384 of perforated cart top 380.

The canister 301 may be placed in cart 300 by lifting the canister 301, and moving and placing it into cart 300. The cart 300 containing the bulk canister 301 may be conveniently moved by simply pushing by hand, since the cart 300 is equipped with heavy duty wheels (rollers) 310. Advantageously, the cart 300 may be pushed into storage and delivery cabinet 350. As depicted in FIG. 1, the cabinet 350 and cart 300 are configured with guides 314 and 364 to assist the operator in placing the cart 300 into cabinet 350. An advantage of the present invention is that since the movable cart 300 functions to contain a spill should it occur, cabinet 350 is reduced in size relative to a conventional cabinet which uses a grating to suspend a canister over a containment reservoir which in this invention is not needed in the bulk cabinet, although the secondary cabinets may use such conventional design. In addition, the canister 301 need not be lifted or raised in order to install it as in a conventional cabinet, since no grating and reservoir is housed within the cabinet. The cabinet and movable self-containment system of this invention thus require less space while nonetheless providing containment. When the systems of this invention are employed in a cleanroom environment, a fork lift is advantageously not needed to place a large canister into the cabinet. This is especially advantageous because cleanroom fork lifts are rare and very expensive, and require a large area and clearance in the area of the cabinet to place the canister inside.

The types of chemicals which may be transferred using the bulk delivery system of this invention may vary widely depending on the type of process tool and desired outcome. Non-limiting examples of representative chemicals include tetraethylorthosilicate ("TEOS"), triethylphosphate, trimethyl phosphite, trimethyl borate, titanium tetrachloride, tantalum compounds, and the like; solvents such as chlorinated hydrocarbons, ketones such as acetone and methylethylketone, esters such as ethyl acetate, hydrocarbons, glycols, ethers, hexamethyldisilazane ("HMDS"), and the like; solid compounds dispersed in a liquid such as barium/strontium/titanate cocktails (mixtures). If the chemical being delivered is solid suspended in an organic liquid, the manifold may be designed so as to allow for liquid flush of all the lines to prevent solids accumulating in the lines upon evaporation of the organic liquid. If dispersions are employed, it is preferable to flush the lines out with liquid solvents such as triglyme or tetrahydrofuran (THP) so that compounds are not precipitated in the lines when the lines are depressurized. These examples of chemicals are not intended to be limiting in any way. The chemicals may be of a variety of purities, and mixtures of chemicals can be used. In one embodiment, a single type of chemical is employed. A given chemical may advantageously have a purity of 99.999% or more with respect to trace metals.

FIG. 6 shows a representative canister, purge manifold, and system supply manifold for use in cabinet 101 when second cabinet 102 is not included. In FIG. 6, a bulk canister 610, which may be a 200 liter canister, is depicted. Upon positive pressure from gas source 630 through lines 631, carrier gas isolation valve 632, canister bypass valve 634, second flowing purge valve 636 ("FP2" valve), and canister inlet valve 638, the bulk canister 610 supplies chemical through lines 611, 612, and 613 and canister outlet valve 640, process line isolation valve 642, and filter assembly 620 to four port process supply manifold 670 where the chemical is split into for streams that exit through exit valves 672 that provide chemical to valve manifold boxes through lines, not shown. The chemical is purified by passing through filter assembly 620 prior to entering the process supply manifold 670. An important aspect of this invention is that the entire filter container 621 may be removed and replaced by actuating filter isolation valves 622A and 622B such that flow is directed through filter bypass valve 624. After breaking appropriate fittings between PLI 642 (which is closed) and isolation valve 622A, and between post filter isolation valve 626 (PFI) and isolation valve 622B, the filter assembly may be changed out with a new assembly. The old assembly containing the filter and chemical may then be handled without any significant down time of the system. This is advantageous because cumbersome, error-prone, and time-consuming replacement of the filter media per se is avoided. In supply manifold 670, distribution supply valves 671 serve to shut off flow of chemical to exit valves 672. The manifold may be equipped with a sampling port. The entire manifold system may be cleared prior to canister change-out or shut down by alternating flowing gas purge and vacuum cycles. In this regard, after depressurization of the canister, a flowing gas purge cycle may be accomplished by a liquid drain of the lines. For example, gas may be introduced from source 630, through CGI 632, CBV 634, PLI 642, canister outlet valve 640, and line 613, thereby clearing liquid into canister 610. If desired, the filter assembly may also be drained, although it would be more common to close isolation valves 622 such that flow moves through filter bypass valve 624, with the liquid drain being performed by flow of gas through line 13 through and into canister 610. It may be appreciated that FP2 636 and first flowing purge valve 650 (FPI) are open so that gas may be released from canister 610 to vent 654 via line 652 as the liquid drain proceeds. This prevents buildup of pressure in canister 610.

After line drain, a cycle purge may be initiated which includes a vacuum step and flowing gas purge. For instance, vacuum supply valve 656 (VGS) may be opened to allow gas into vacuum source 657, such as a Venturi generator, which places a vacuum on the manifold system via line 652, upon closing canister inlet valve 638 and canister outlet valve 640. Alternatively, a vacuum pump may be employed. Thereafter, a flowing purge may be effected after closing VGS 656 (canister inlet and outlet valves 638 and 640 remain closed) by introducing gas into the manifold as desired from gas source 630. The cycle purge may be repeated any number of times to ensure that essentially no chemical is in the lines prior to breaking the fittings to replace canister 610.

Instead of employing line 629, which serves to provide gas for flowing purge to tie directly into line 613, dotted line 629 may alternatively be employed. In this alternative configuration, line drain may be performed by opening post filter purge valve 627 (PFP) to force chemical into canister 610. In this design, PFI 622B may be a three-way valve. The advantage of this arrangement is that the line and system downstream of PFI 629 remains wetted out.

When the system illustrated in FIGS. 1 or 1A includes secondary bulk cabinet 102, the line which connects the secondary bulk canister may be tied in at point 680, for example, in line 613 which feeds supply manifold 670. When this configuration is employed, it is preferable to use dotted line 629 to supply gas for purge through PFP 627 so that the secondary bulk canister may supply chemical downstream of PFI 626 while canister 610 is being replaced or if the lines are otherwise down for maintenance, repairs, or the like.

It may be appreciated that canister outlet valve 640 also serves as a third flowing purge valve. The gas may thus purge the system through line 641, whereby there are essentially no dead legs in the manifold.

One embodiment of the system that may be included in the cabinet 101 of FIG. 1 is illustrated in FIGS. 36 and 37 of U.S. Pat. No. 5,711,354, incorporated herein by reference.

The cabinet of this invention may be constructed to render it suitable for use in hazardous, explosive environments. In general, this is accomplished by isolating all electronic components in areas that are blanketed with an inert gas. In this way, a spark emanating from an electronic component will be in an environment having essentially no oxygen, which significantly reduces the likelihood of an explosion due to vapors that may be present in the cabinet. One non-limiting, representative embodiment of this cabinet is depicted in FIGS. 7A and 7B.

Figure 7A:
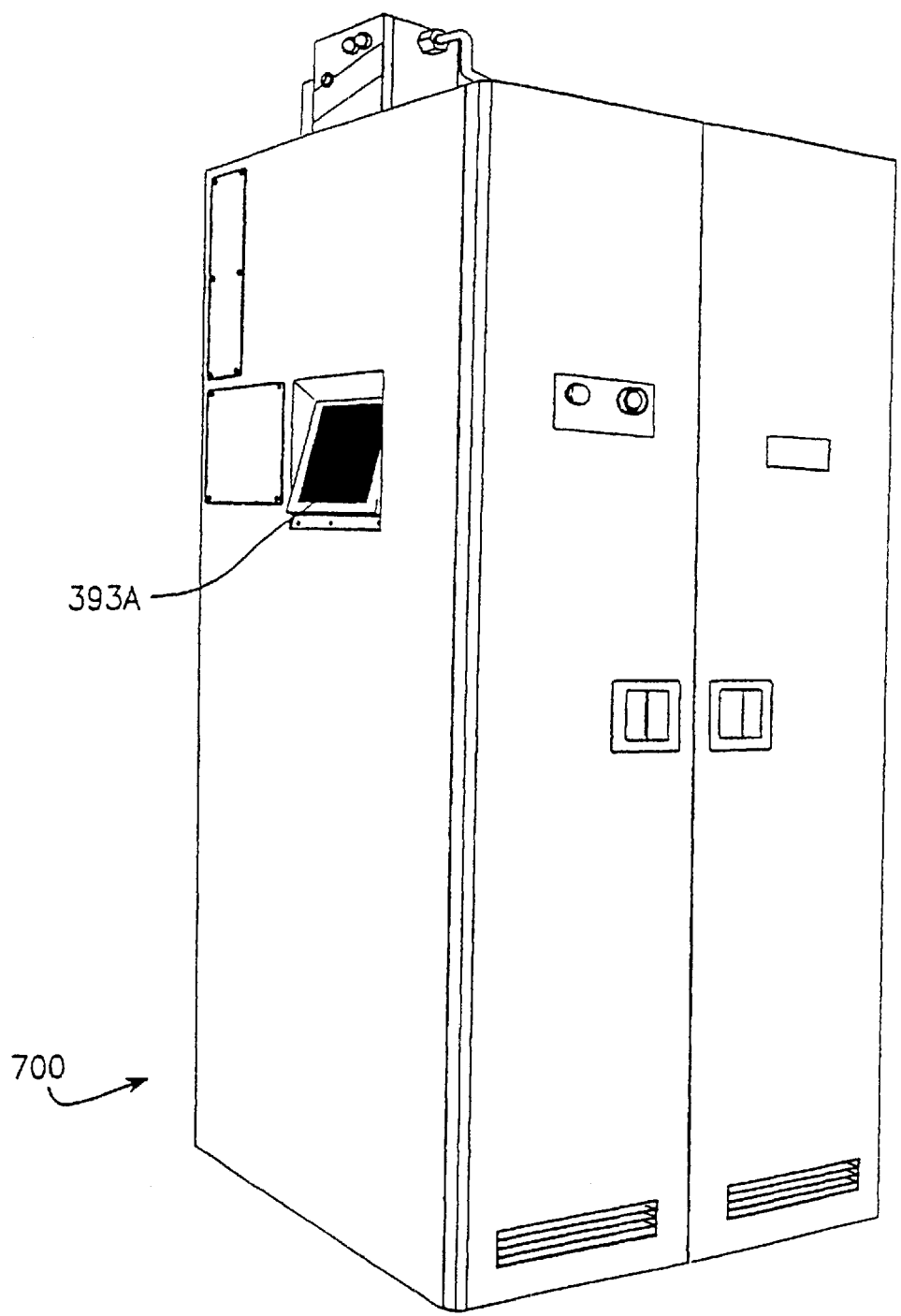
FIGS. 7A and 7B illustrate a cabinet of this invention that may be constructed to render it suitable for use in hazardous, explosive environments by isolating all electronic components in areas that are blanketed with an inert gas.
Figure 7B:
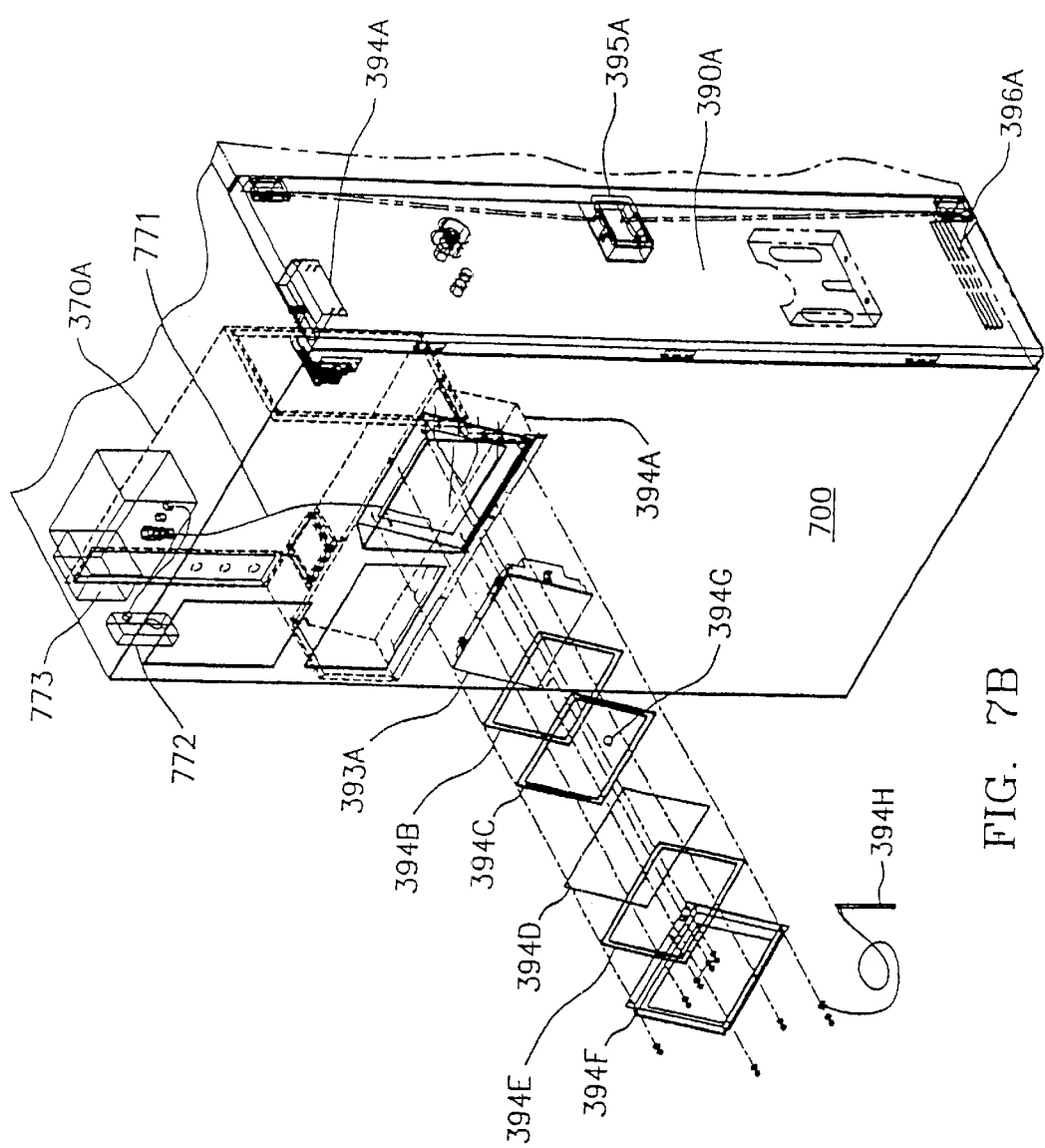

In FIGS. 7A and 7B, the numbers shown correspond to the components described above with respect to FIG. 3, with the proviso that in FIGS. 7A and 7B the numbers are followed with the letter "A". It is seen that in FIGS. 7A and 7B, the control box 370A and touch screen 383A have been isolated in the cabinet 700. The control box 370A may include electronic instrumentation (not shown) such as the process control instrumentation. During use the housings for the control box 370A and 383A are blanketed in an inert gas, which may be supplied by one or more purge lines 771. The one or more purge lines 771 may be connected to the housing for touch screen 383A. Additional conduits may be employed to allow inert gas to flow to the control box, directly, that is not connected to the purge line 771. In this way, a single line may be employed to provide a inert gas blanket over both the touch screen and the control box. One or more pressure relief valves 772 may be used to provide initial purge and to vent excess inert gas from the housings used for the control box and the touch screen. A purge control unit 773 may be included which serves to time the initial high pressure purge, and to monitor and meter inert gas to the isolated components. Conventional purge controllers may be employed such as is available from Expo Safety Systems.

As shown in FIG. 7B, the touch screen 393A may be encased in a housing depicted by phantom lines 394A. To fully isolate the touch screen, additional components may be employed such as use of a plastic window (e.g., an electro-conductive polycarbonate sheet) 394D that is held in place by gasket material 384B, plastic (e.g., acrylic) spacer 384C having holes for purge gas feed, touch screen window gasket material 394E, and purge enclosure frame 394F. When the touch screen is further isolated in this representative fashion, the touch screen may be accessed by use, for example, of a steel ball 394G which is manipulated through use of magnetic wand and lanyard 394H.

Figure 8:
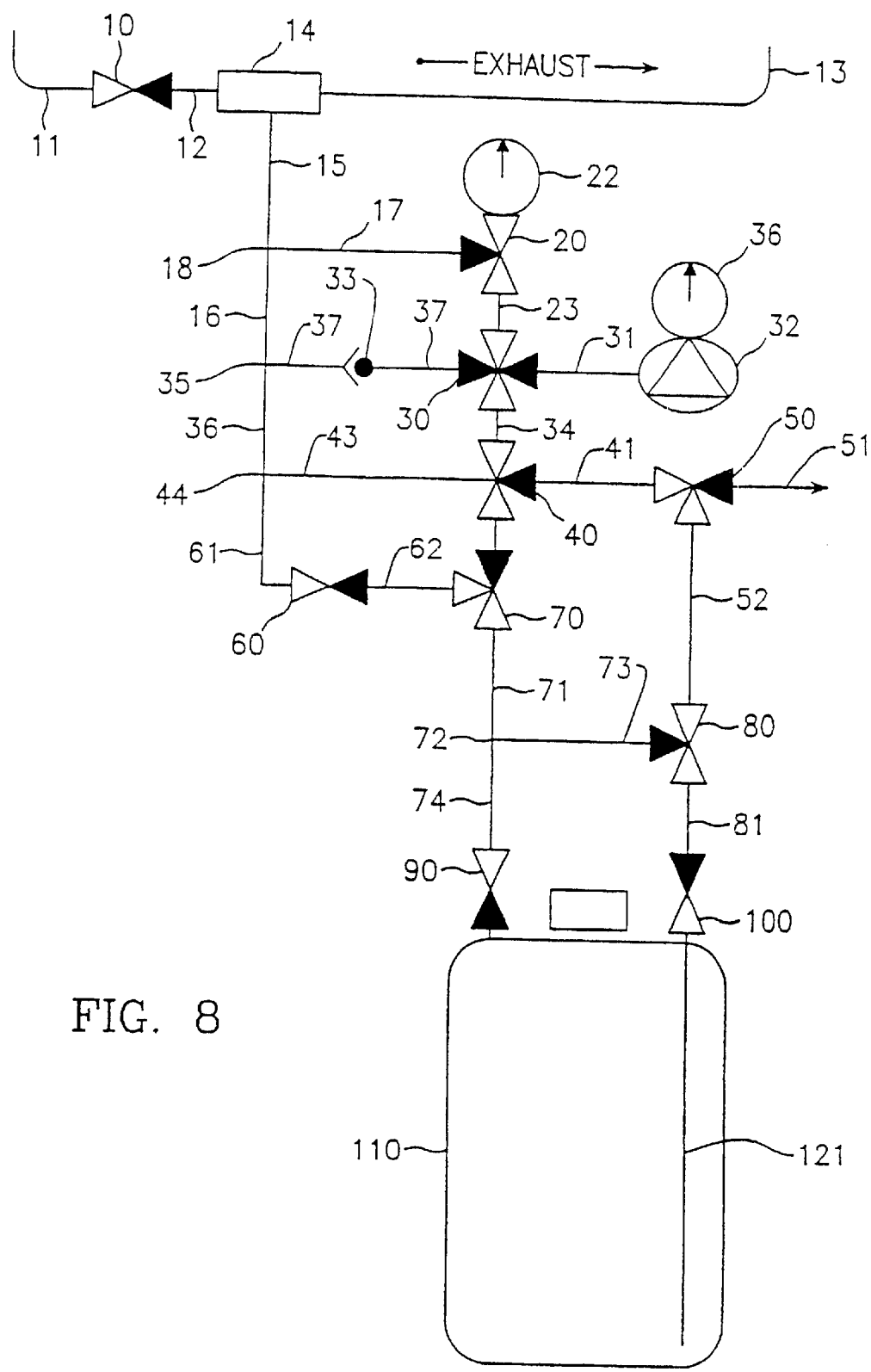
FIG. 8 depicts a representative manifold configuration of this invention.

In FIG. 8 there is shown a manifold system of this invention. In FIG. 8, a vacuum source 14 such as a Venturi vacuum generator may be connected to vacuum supply valve ("VOS") 10 via line 12. VGS 10 functions to control the flow of gas (such as nitrogen, helium, or argon) via inert gas line 11 to the vacuum source 14 if the vacuum source is a Venturi vacuum generator. Vacuum source 14 may also be attached to exhaust line 13 which exits to exhaust. Vacuum source 14 may be connected to low pressure vent valve ("LPV") 20, carrier gas isolation valve ("CGI") 30, canister bypass valve ("CBV") 40, and control valve ("CP3") 60. CGI may also be referred to as a carrier gas inlet valve. In FIG. 8, vacuum source 14 is connected to LPV 20 via line 15, tee 18, and line 17; to CGI 30 via line 15, tee 18, line 16, tee 35, and line 37; to CBV 40 via line 15, tee 18, line 16, tee 35, line 36, tee 44, and line 61. Check valve 33 in line 37 is closed unless and until the manifold eclipses the desired release pressure. Hence, vacuum source 14 is typically closed off to CGI 30 via line 37. Generally, the check valve 33 may be set to activate if the manifold pressure surpasses a preset level, such as about 100 pounds per square inch. The check valve serves to vent gas if pressure in the system reaches a selected level. The function of LPV 20 is to control venting and evacuation of manifold and canister during start-up and canister change-out. Vacuum gauge 22 may also be connected to LPV 20. Vacuum gauge 22 may function to monitor vacuum during purge cycles. Line 23 may connect LPV 20 to CGI 30. Line 31 may connect CGI 30 to regulator 32 which may supply a flow of pressurized inert gas. A delivery pressure gauge 36 may be tied into regulator 32 to monitor regulator pressure and pressure during all operations.

In FIG. 8, line 34 may connect CGI 30 to CBV 40. Line 41 and 42 may attach CBV 40 to process line isolation valve ("PLI") 50 and to control valve ("CP2") 70. The function of PLI 50 is to control the flow of chemical out of the manifold. CGI 30 functions to control the pressurized gas supply to the manifold. The function of CBV 40 is to control the supply of pressure or vacuum to PLI 50 and to line 71. Line 51 may carry chemicals to either a device outside the system, or to another canister to be refilled. Line 52 may serve to link PLI 50 to control valve ("CP1") 80. Line 61 may connect control valve 60 to control valve 70. From control valve 70, line 71 may lead to tee fitting 72, with lines 73 and 74 running from tee 72 to control valve 80 and canister inlet valve ("CI") 90, respectively. CI 90 functions to control pressurization and evacuation of a canister. Control valve 80 may link to canister outlet valve ("CO") 100 via line 81. CO 100 functions to control the flow of chemical from a canister 110 during chemical delivery and the purging of the canister outlet weldment during canister changes. CI 90 and CO 100 serve to couple the manifold to the corresponding structures on a supply canister, typically in conjunction with fittings such as male and female threaded joints. Fittings (couplers) to join the manifold to canister 110 are typically present between CI 90 and tee 72, and between CO 100 and CP1 80. If CO 100 is a dual activator valve, tee 72 can be shifted down to directly connect with CI 90, such that a line connects the dual activator directly to CI 90.

Canisters 110 may be loaded with a variety of chemicals, and are typically burdened with high purity chemicals for use in semiconductor manufacture. For example, the canisters may contain TEOS, arsenic compounds, titanium compounds, boron compounds, copper compounds, and so forth. In one embodiment of this invention, the canister 110 is at least partially filled with a chemical which is at least 99.9999% pure based on the amount of trace metals in the chemical.

The aforementioned lines, which may also be referred to as conduits, tubing, pipes, passages, and the like, may be constructed of metal tubing, for example, such as stainless steel tubing. Each of the valves may be conventional pneumatically actuated valves, such as a NUPRO 6L-M2D-111-P-HIII gas control valve. Likewise, the regulator can be a standard type, such as an AP Tech 1806S3PW F4-F4 V3 regulator. The system may be assembled using conventional methods, such as by using pressure fitting valves, by welding, and the like. The valves may be controlled using conventional process control such as an Omron programmable controller box wired to a touch screen control panel. Alternatively, the valves may be controlled using an ADCS APC™ Controller which incorporates an imbedded microprocessor for command sequence execution, with software residing on an EPROM. The control unit, for example, may control flow of pressurized gas to open or close pneumatic valves.

Figure 9:
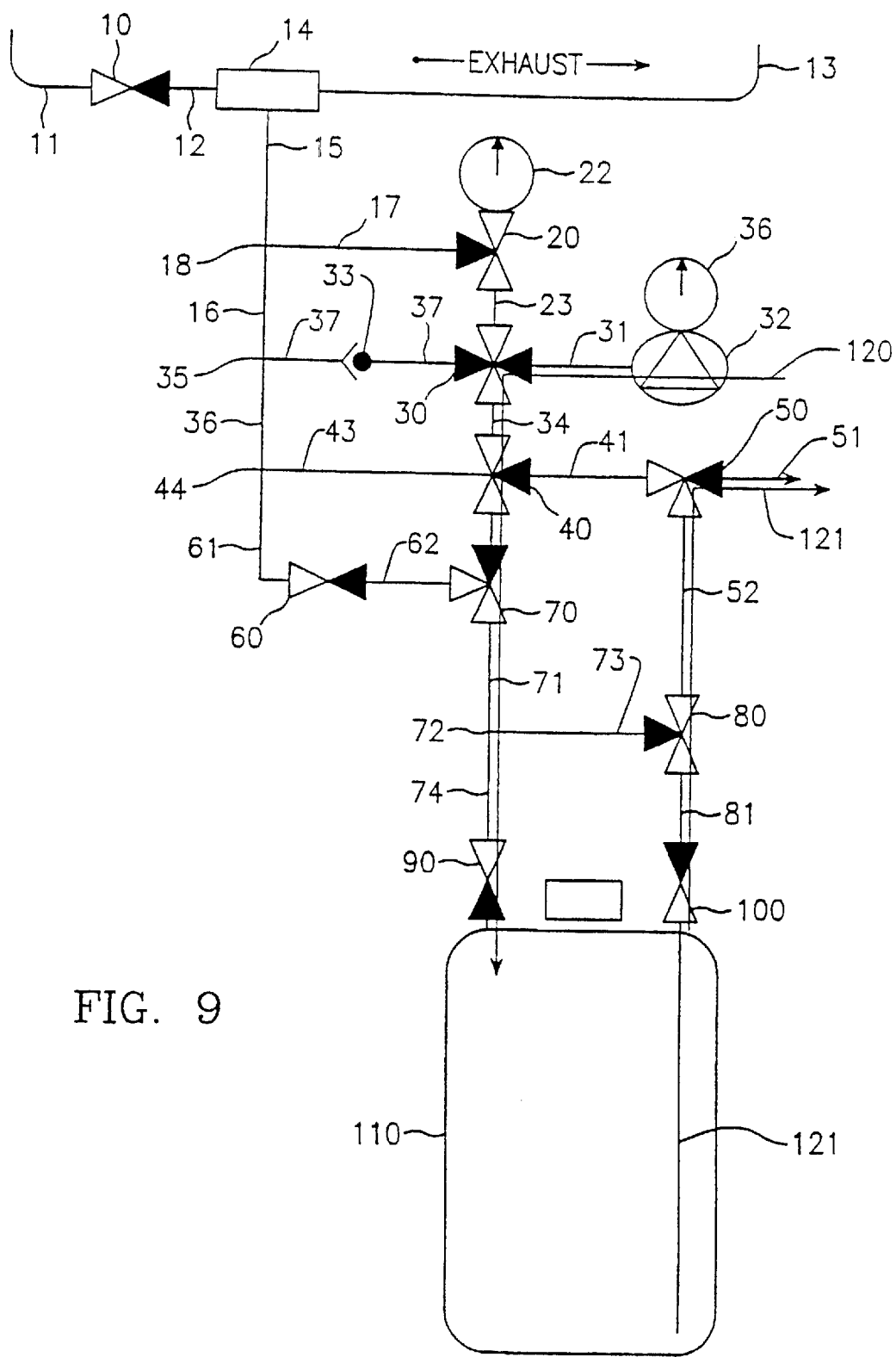
FIG. 9 depicts the path of gas in the manifold while a canister is in service.

During use, the manifold of this invention may be operated as follows. To push chemical out of the canister 110 to the delivery point, the valves in the manifold are appropriately opened and closed to allow pressurized gas into the system and into the canister. In FIG. 9, line 120 illustrates the path of pressurized gas entering canister 110, with line 121 showing the path of liquid chemical exiting canister 110 through a dip tube 111. Thus, pressurized gas from a source (not shown) is released by regulator 32 into line 31. The gas thereafter passes through open CGI 30, then through line 34, CBV 40, line 71, CI 90, and into canister 110. Pressure from entering gas forces liquid chemical up the dip tube, and through CO 100, line 81, CP1 80, line 52, PLI 50, and out line 51 to the receiving point.

Figure 10:
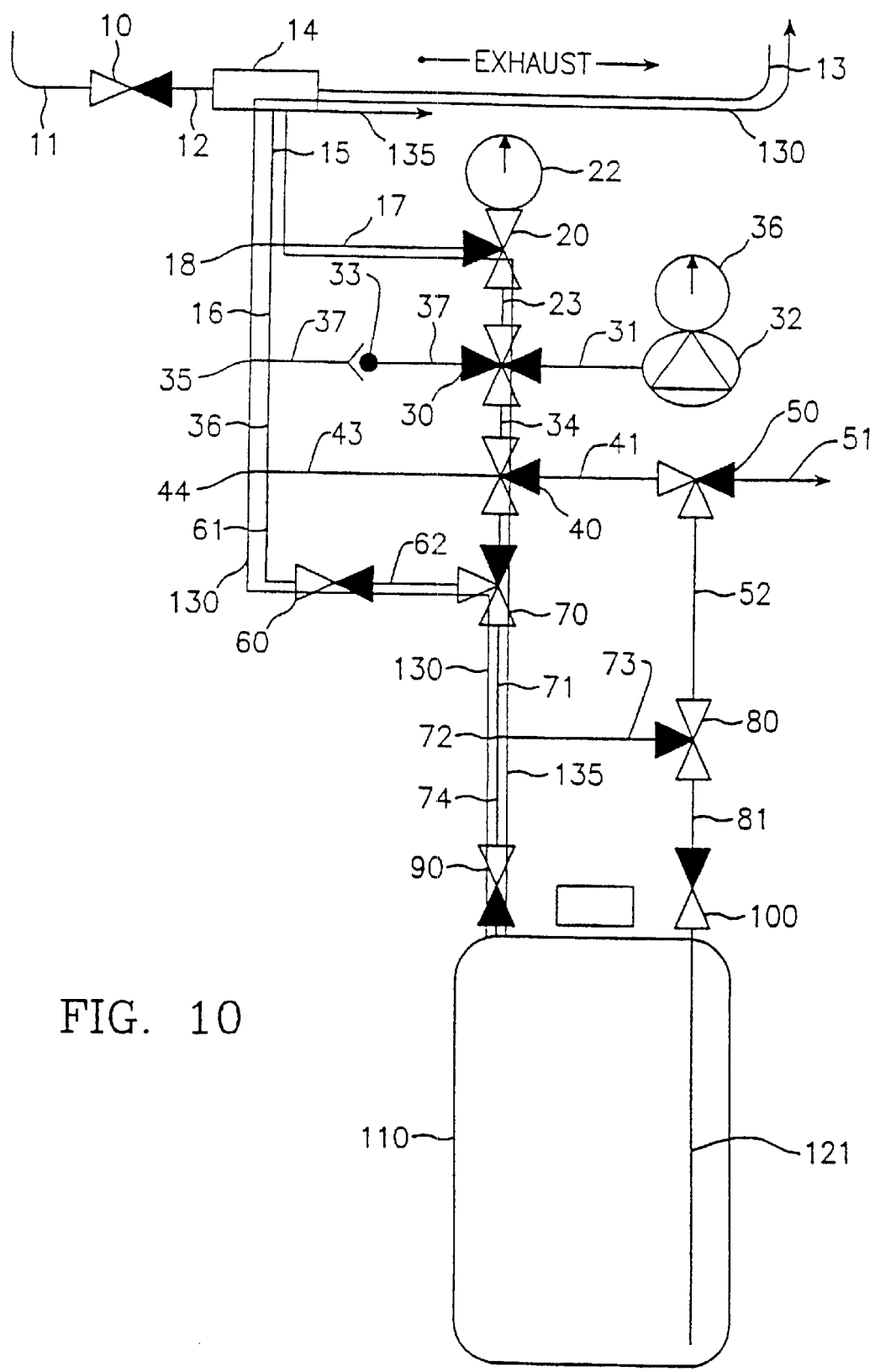
FIG. 10 depicts the path of flow in the manifold during a depressurization step to remove the head pressure in the canister.

When a supply canister (even a full canister) is being changed out, the lines may be purged to rid the manifold of residual chemicals. The first step is depressurization, which functions to remove the head pressure in canister 110. Depressurization may be affected in a few ways. For example, two procedures by which depressurization may occur are depicted in FIG. 10. In one depressurization method, depicted by solid line 130, VGS 10 is opened to allow gas to flow from line 11 through line 12 and into vacuum source 14 such that a vacuum is generated with the flow exiting via line 13 to exhaust. The vacuum which is generated in source 14 pulls a vacuum on line 15, tee 18, line 16, tee 35, line 36, tee 44, line 61, through open CPI 60, line 62, CP2 70, line 71, tee 72, line 74, and open CI 90, thereby pulling a vacuum on the head space of canister 110. Alternatively, depressurization can be affected by opening LPV 20, CP2, and CI 90 so that the vacuum is pulled via solid line 135.

Figure 11:
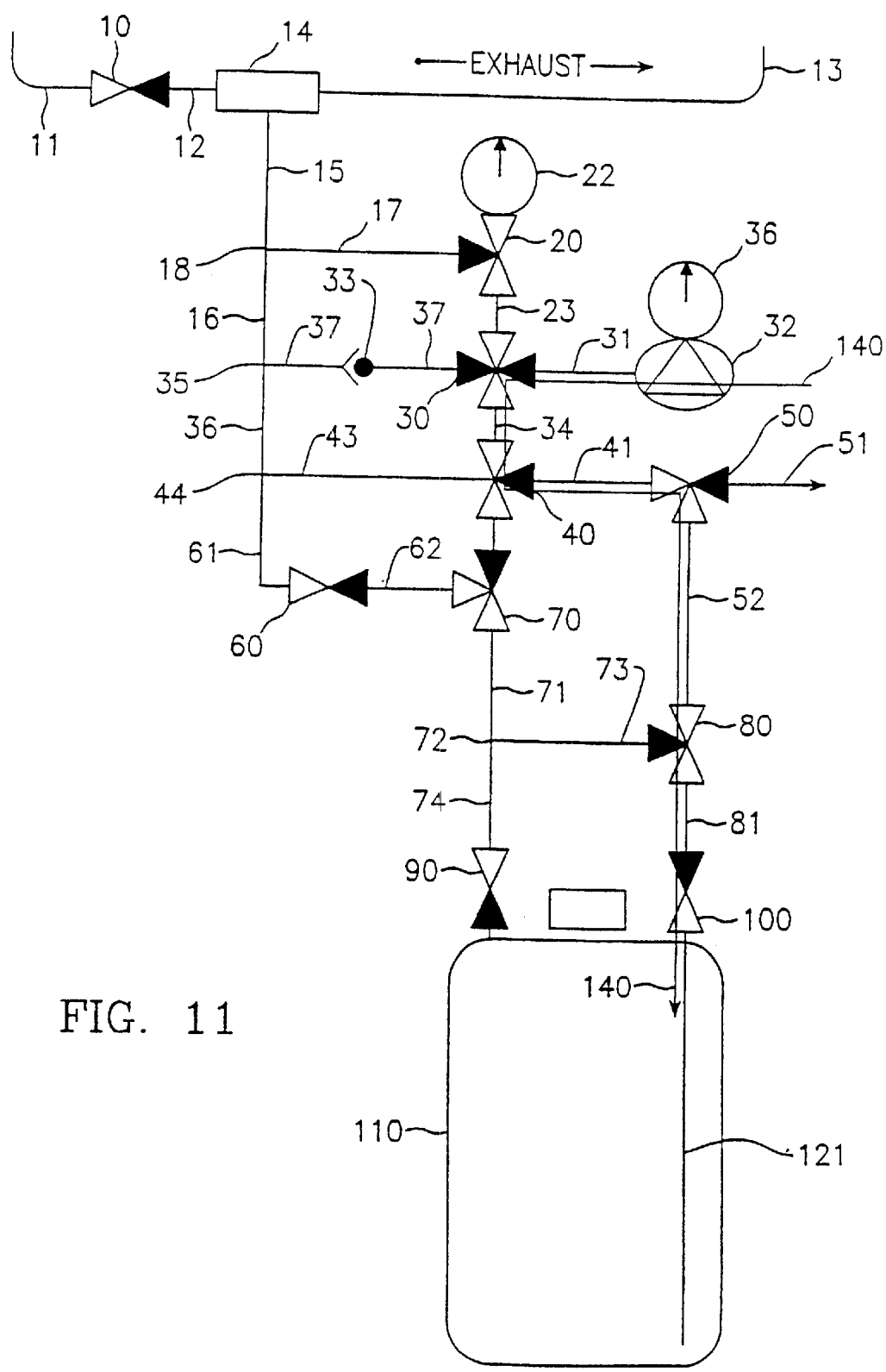
FIG. 11 depicts the flow of gas in the manifold during a liquid drain.

After depressurization, a liquid drain is instituted to clear the lines (weldments) of liquid. Thus, in FIG. 11 gas is introduced via regulator 32 into line 31. CGI 30, CBV 40, and CO 100 are open such that gas flows through lines 34, 41, 52, and 81 such that liquid chemical is forced back into canister 110. The flow of gas during the line drain-is-illustrated by solid line 140.

Figure 12:
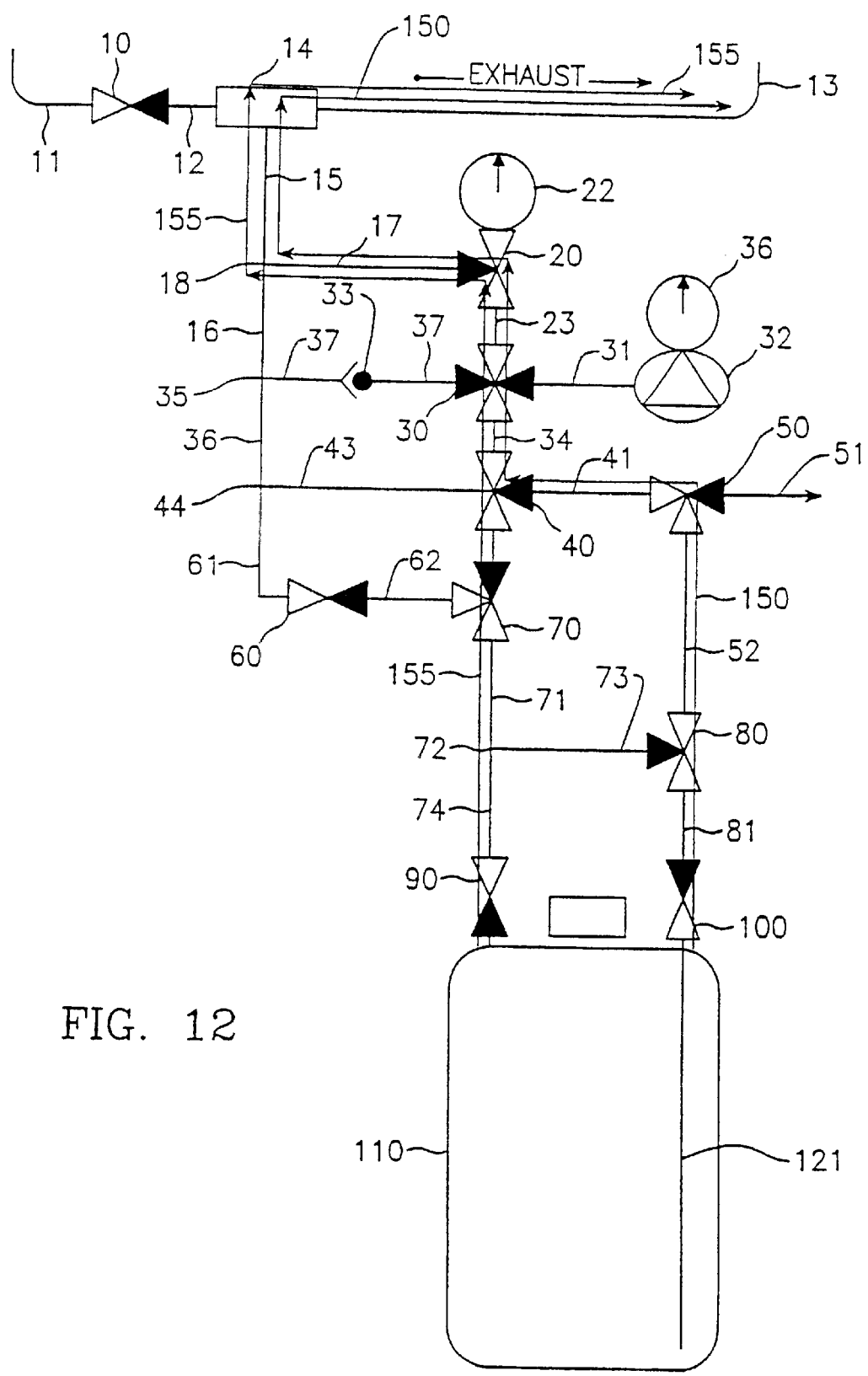
FIG. 12 depicts the flow of gas in the manifold during a cycle purge.

Thereafter, a cycle purge is instituted which includes a vacuum step and a flowing purge step as illustrated in FIGS. 5 and 6, respectively. The vacuum step may be accomplished in a variety of ways, including via the configurations depicted by solid lines 150 and 155 in FIG. 12. Thus, in one embodiment, CBV 40 and LPV 20 is open such that when VGS 10 is opened to allow gas into vacuum source 14 via lines 11 and 12, a vacuum is drawn out to exhaust via line 13, with a vacuum thus being pulled on lines 15, 17, 23, 34, 41, 52, and 81. Alternatively, LPV 20 and CP2 70 are open such that a vacuum is pulled on lines 15, 17, 23, 34, 42, 71 and 74. In addition, LPV 20, CP2 70 and CBV 40 can all be open such that a vacuum is pulled on lines 42, 71, and 74 as well as on lines 41, 52, and 81. The openings can be alternated so that lines 42/71/74 and 41/52/81 are intermittently evacuated.

Figure 13:
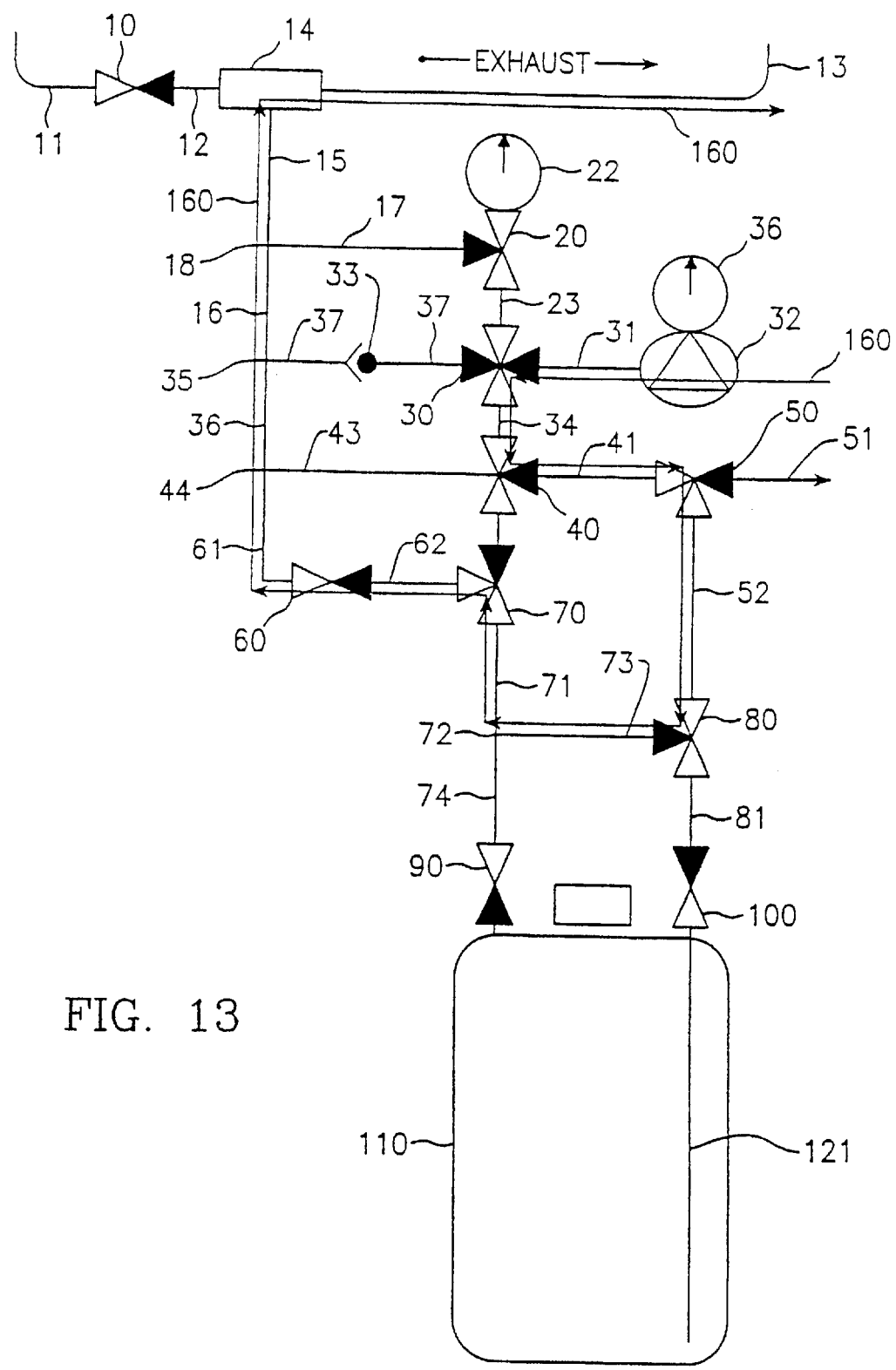
FIG. 13 depicts a flowing purge in the manifold during a cycle purge.

In FIG. 13, a flowing purge of the cycle purge is illustrated. In FIG. 13, regulator 32 allows pressurized gas to enter line 31. With CGI 30, CBV 40, CP1 80, and CP1 60 open (note CI 90 and CO 100 are closed), the gas flows through lines 34, 41, 52, 73, 71, 62, 61, 36, 16, 15, and 13 to thereby purge the manifold, as depicted in FIG. 13 by solid line 160. LPV 20 may be intermittently opened so that lines 23 and 17 may be purged. After purge, the fittings are typically broken while a positive pressure on the manifold is maintained so that moisture does not enter the manifold. For instance, CGI 30, CBV 40, and CP2 70 may be opened so that gas flows out lines 74 and 81 after the fittings are broken. After a new canister is seated, the purge cycle is typically repeated to remove any water or other contaminant that might have entered the manifold, as well as any water in the fittings and weldments of the new canister.

Figure 14:
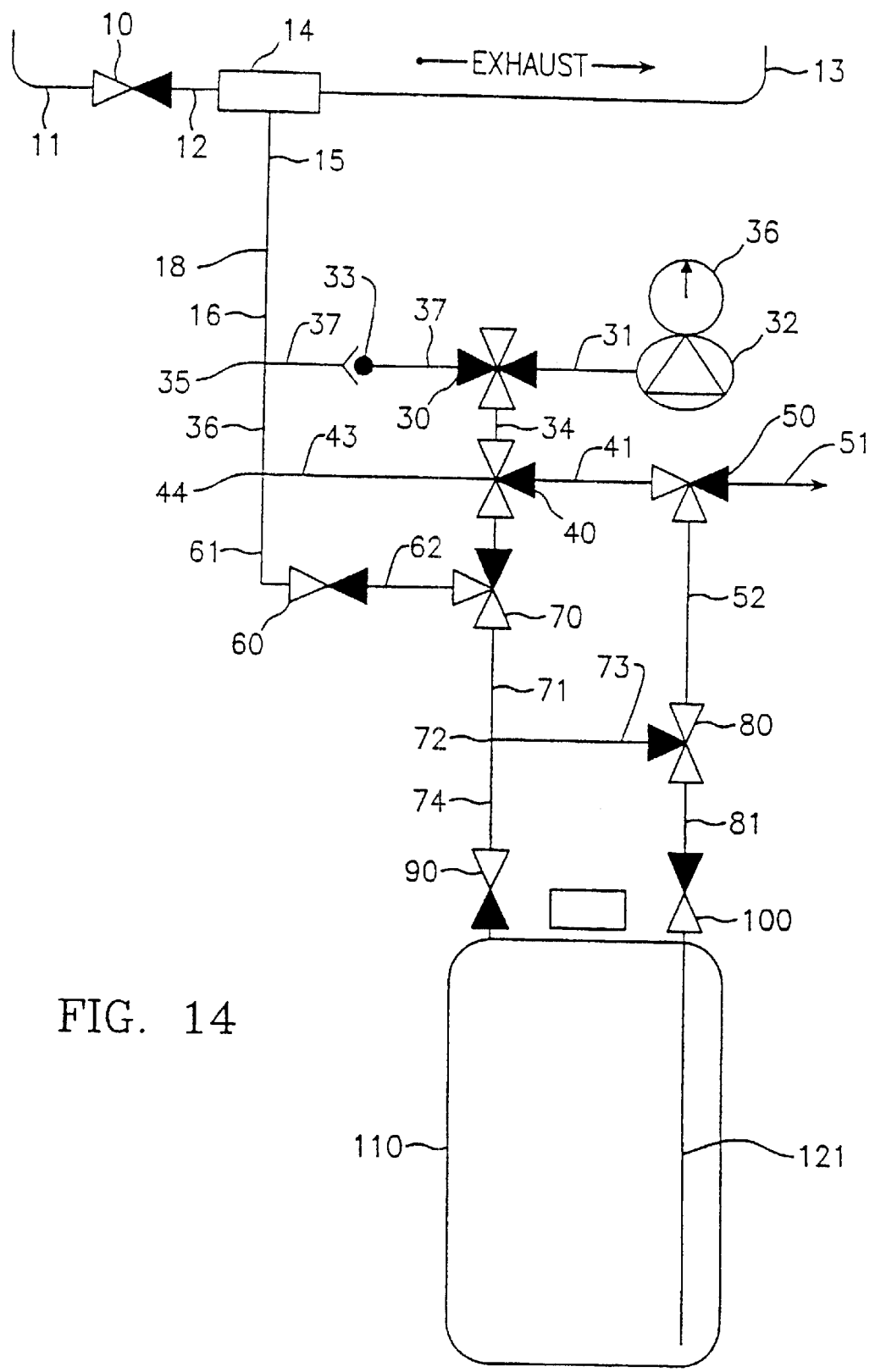
FIG. 14 depicts another representative manifold configuration of this invention.
Figure 15:
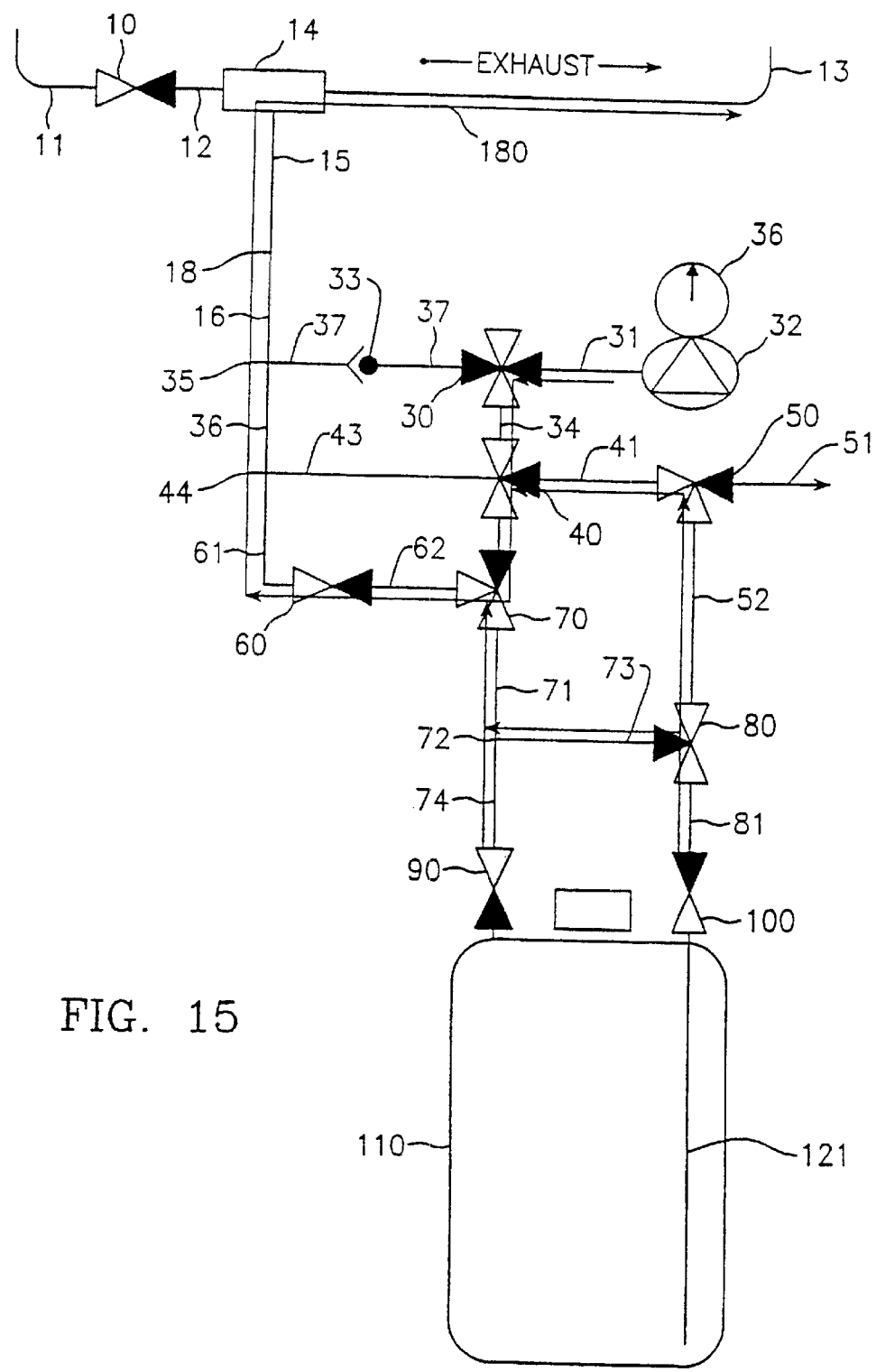
FIG. 15 depicts the flow of gas in the manifold of FIG. 14 during a cycle purge.

In FIG. 14 there is shown an alternative embodiment of this invention which is similar to the embodiment depicted in FIG. 8 except that LPV 20, lines 17 and 23, and gauge 22 are absent. If CO 100 is a dual activator valve, tee 72 can be shifted down to directly connect with CI 90 and control valve 80 directly attached to the dual activator, such that a line connects the dual activator directly to CI 90 and such that the number of potential dead legs in the manifold is reduced. In the embodiment shown in FIG. 14, line 43 to CBV 40 may be optionally removed. The same flow scheme shown in FIG. 9 may be employed to push chemicals out of canister 110 for the configuration in FIG. 14. Depressurization of the configuration shown in FIG. 14 may be accomplished using the flow scheme depicted as line 130 in FIG. 10. The liquid drain depicted as solid line 140 in FIG. 11 may then be employed for the configuration of FIG. 14. The vacuum step may be accomplished as set forth in FIG. 15 as depicted by line 180. The flowing purge of FIG. 13 may be used for the configuration in FIG. 14. The embodiment of the invention has many advantages including a reduced number of valves which results in lower cost of the manifold, a reduction in the number of points where a leak may occur as well as a reduction in the chances for valve failure for a given manifold. This embodiment also reduces the number of dead legs in the system, resulting in a more effective flowing purge. Owing to the improved ability to remove chemicals from the lines during canister changes, the manifold of this embodiment provides a system which may be used with hazardous chemicals, such as arsenic compounds. Likewise, this manifold embodiment permits improved use of dispersions, such as metals or solid compounds dispersed in an organic carrier liquid such as diglyme and triglyme. If dispersions are employed, it is preferable to flush the lines out with liquid solvents such as triglyme or tetrahydrofiran (THF) so that compounds are not precipitated in the lines when the lines are depressurized. Additionally, for any of the embodiments of this invention, it is contemplated that the manifold can be heated to accelerate evaporation of chemicals in the lines. In this regard, the manifold can be maintained in a heated environment, wrapped with heating tape connected to a variac or the like. To facilitate evaporation during a flowing purge, heated gas could alternatively be employed, such as heated argon, nitrogen, or other inert gas. Combinations of these techniques can also be employed. For some types of chemicals, it may be possible to purge with reactive chemicals, which react with one or more of the compounds in the line to produce more readily evacuated compounds.

The manifolds of this invention may include a sensor attached, for example, in line 15 to determine whether the lines of the manifold contain any chemical. Similarly, a sample port could be included in line 15 where a sample of gas from the line can be withdrawn and tested using an analytical device to test for the presence of chemical.

Further modifications and alternative embodiments of this invention will be apparent to those skilled in the art in view of this description. Accordingly, this description is to be construed as illustrative only and is for the purpose of teaching those skilled in the art the manner of carrying out the invention. It is to be understood that the forms of the invention herein shown and described are to be taken as presently preferred embodiments. Equivalent elements may be substituted for those illustrated and described herein, and certain features of the invention may be utilized independently of the use of other features, all as would be apparent to one skilled in the art after having the benefit of this description of the invention.

What is claimed is:

1. A bulk chemical delivery system, comprising: a bulk chemical canister (103) that is connected to at least one manifold box (110), wherein each manifold box has at least two output lines (112), wherein at least one output line connects to a secondary canister (121), characterized in that the bulk chemical canister is housed within a transportation and containment cart (300) that is housed within a cabinet (350), wherein the secondary canister has a smaller capacity than the bulk canister, a first supply manifold that connects to the bulk canister and manifold box, and wherein the bulk canister and first supply manifold arc housed in a cabinet.

2. The system of claim 1 wherein each secondary canister connects to a line adapted to supply chemical to the process tool.

3. The system of claim 1 further comprising a programmable controller which controls the flow of chemical through the system.

4. The system of claim 1 wherein each secondary canister (121) is housed in a cabinet (120), find wherein two or more canisters (121) may optionally be housed in a cabinet.

5. The system of claim 1 wherein the bulk canister (103) has a capacity of at least about 200 liters.

6. The system of claim 1 wherein at least one secondary canister is connected to a process tool.

7. The system of claim 1 wherein the system contains chemical that is tetraorthosilicate.

8. The system of claim 7 wherein the tetraethylorthosilicate is 99.9999% or more free of trace metals.

9. The system of claim 1 wherein the system contains chemical that is tetraethylortliosilicate, triethylphosphate, trimethyl phosphite, trimiethyl borate, titanium tetrachlloride, or a tantalum compound, wherein the chemical is 99.9999% or more free of trace metals.

10. The system of claim 1 further comprising a second bulk canister that provides chemical to at least one valve manifold box when the first bulk canister is not supplying chemical.

11. The system of claim 1 wherein the bulk canister also directly connects to al least one process tool, to a secondary canister, or combination thereof.

12. A manifold system for use in refill of canister containing chemicals, comprising a first manifold which comprises:

(1) a vacuum supply valve (10);

(2) a vacuum source (14);

(3) a pressure vent valve (20);

(4) a carrier gas isolation valve (30);

(5) a caster bypass valve (40);

(6) a process line isolation valve (50);

(7) a first control valve (60);

(8) a canister inlet valve (90);

(9) a canister outlet valve (100);

(10) a second control valve (70);

(11) a third control valve (80)

wherein the vacuum, supply valve is contracted to the vacuum source (20);

wherein the vacuum source (14) is connected to the pressure vent valve (20) and the first control valve (60);

wherein the first control valve (60) connects to the second control valve (70);

wherein the carrier gas isolation valve (30) is connected to the pressure vent valve (20) and the canister bypass valve (40);

wherein the canister bypass valve (40) is further connected to the carrier gas isolation valve (30) and the second control valve (70);

wherein the process line isolation valve (90) is also connected to the third control valve (80);

wherein the canister inlet valve (90) is the connected to the second control valve (70)and the third control valve (80); and wherein the canister outlet valve (100) is further connected to the third control valve (80).

13. The manifold system of claim 12, wherein the valves are pneumatically activated.

14. The manifold system of claim 12, wherein the valves the connected by stainless steel tubing, and the valves arc stainless steel.

15. The manifold system of claim 12, wherein carrier gas isolation valve (30) is further connected to an inert gas source.

16. The manifold system of claim 12, wherein the canister inlet valve (90) and canister outlet valve (100) are pneumatically actuated valves.

17. The manifold system of claim 12, further comprising a second manifold that is connected to the vacuum supply valve (10).

18. The manifold system of claim 12, wherein the first manifold includes a first tee (18) fitting connecting pressure vent valve (20), Vacuum source (14), and first control valve (60).

19. The manifold system of claim 12, wherein a second tee (72) is directly connected to canister inlet valve (90), second control valve (70) and third control valve (80).

* * * * *